(12) United States Patent
Chen et al.

(10) Patent No.: US 10,916,519 B2
(45) Date of Patent: Feb. 9, 2021

(54) METHOD FOR MANUFACTURING SEMICONDUCTOR PACKAGE WITH CONNECTION STRUCTURES INCLUDING VIA GROUPS

(71) Applicant: Taiwan Semiconductor Manufacturing Company, Ltd., Hsinchu (TW)

(72) Inventors: Chien-Hsun Chen, Zhutian Township (TW); Jiun Yi Wu, Zhongli (TW); Chien-Hsun Lee, Chu-tung Town (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/157,426

(22) Filed: Oct. 11, 2018

(65) Prior Publication Data
US 2019/0378809 A1 Dec. 12, 2019

Related U.S. Application Data

(60) Provisional application No. 62/682,637, filed on Jun. 8, 2018.

(51) Int. Cl.
*H01L 23/00* (2006.01)
*H01L 25/10* (2006.01)
*H01L 21/56* (2006.01)

(52) U.S. Cl.
CPC ............ *H01L 24/25* (2013.01); *H01L 21/568* (2013.01); *H01L 24/24* (2013.01); *H01L 24/82* (2013.01);
(Continued)

(58) Field of Classification Search
CPC ...... H01L 2224/2543; H01L 2224/2541; H01L 2224/25174; H01L 2224/25175;
(Continued)

(56) References Cited

U.S. PATENT DOCUMENTS 7,319,197 B2    1/2008  Oggioni et al.
9,035,470 B2 *  5/2015  Takemoto ............... H01L 23/48
                                                        257/737
(Continued)

FOREIGN PATENT DOCUMENTS

CN     106571356 A    4/2017
CN     107068574 A    8/2017
(Continued)

*Primary Examiner* — Daniel Luke
(74) *Attorney, Agent, or Firm* — Slater Matsil, LLP

(57) ABSTRACT

A method includes placing a package component over a carrier, encapsulating the package component in an encapsulant, and forming a connection structure over and electrically coupling to the package component. The formation of the connection structure includes forming a first via group over and electrically coupling to the package component, forming a first conductive trace over and contacting the first via group, forming a second via group overlying and contacting the first conductive trace, wherein each of the first via group and the second via group comprises a plurality of vias, forming a second conductive trace over and contacting the second via group, forming a top via overlying and contacting the second conductive trace, and forming an Under-Bump-Metallurgy (UBM) over and contacting the top via.

20 Claims, 34 Drawing Sheets

(52) U.S. Cl.
 CPC .. *H01L 25/105* (2013.01); *H01L 2224/24011*
  (2013.01); *H01L 2224/24137* (2013.01); *H01L*
   *2224/25171* (2013.01); *H01L 2224/25174*
  (2013.01); *H01L 2224/25177* (2013.01); *H01L*
   *2224/82005* (2013.01); *H01L 2224/82951*
    (2013.01); *H01L 2225/1058* (2013.01)

(58) Field of Classification Search
 CPC . H01L 2224/25177; H01L 2224/25171; H01L
        2224/02375; H01L 24/25
 See application file for complete search history.

(56) References Cited

U.S. PATENT DOCUMENTS

| | | | |
|---|---|---|---|
| 9,059,084 B2 * | 6/2015 | Sugimoto | H01L 24/25 |
| 9,449,953 B1 | 9/2016 | Shih et al. | |
| 9,748,216 B2 | 8/2017 | Chen et al. | |
| 9,919,914 B2 | 3/2018 | Cheng et al. | |
| 10,199,346 B2 * | 2/2019 | Teh | H01L 23/50 |
| 10,262,935 B2 * | 4/2019 | Kim | H01L 23/5225 |
| 10,304,700 B2 | 5/2019 | Liu et al. | |
| 2015/0371947 A1 * | 12/2015 | Chen | H01L 23/3128 257/774 |
| 2017/0125347 A1 | 5/2017 | Hu | |
| 2017/0373032 A1 * | 12/2017 | Oh | H01L 21/561 |

FOREIGN PATENT DOCUMENTS

| | | | |
|---|---|---|---|
| KR | 20050009998 A | 1/2005 | |
| KR | 20140043651 A | 4/2014 | |
| TW | 201532287 A | 8/2015 | |
| TW | 201737428 A | 10/2017 | |

* cited by examiner

METHOD FOR MANUFACTURING SEMICONDUCTOR PACKAGE WITH CONNECTION STRUCTURES INCLUDING VIA GROUPS

PRIORITY CLAIM AND CROSS-REFERENCE

This application claims the benefit of the following provisionally filed U.S. patent application Ser. No. 62/682,637, filed Jun. 8, 2018, and entitled "Semiconductor Packages and Method Forming Same," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
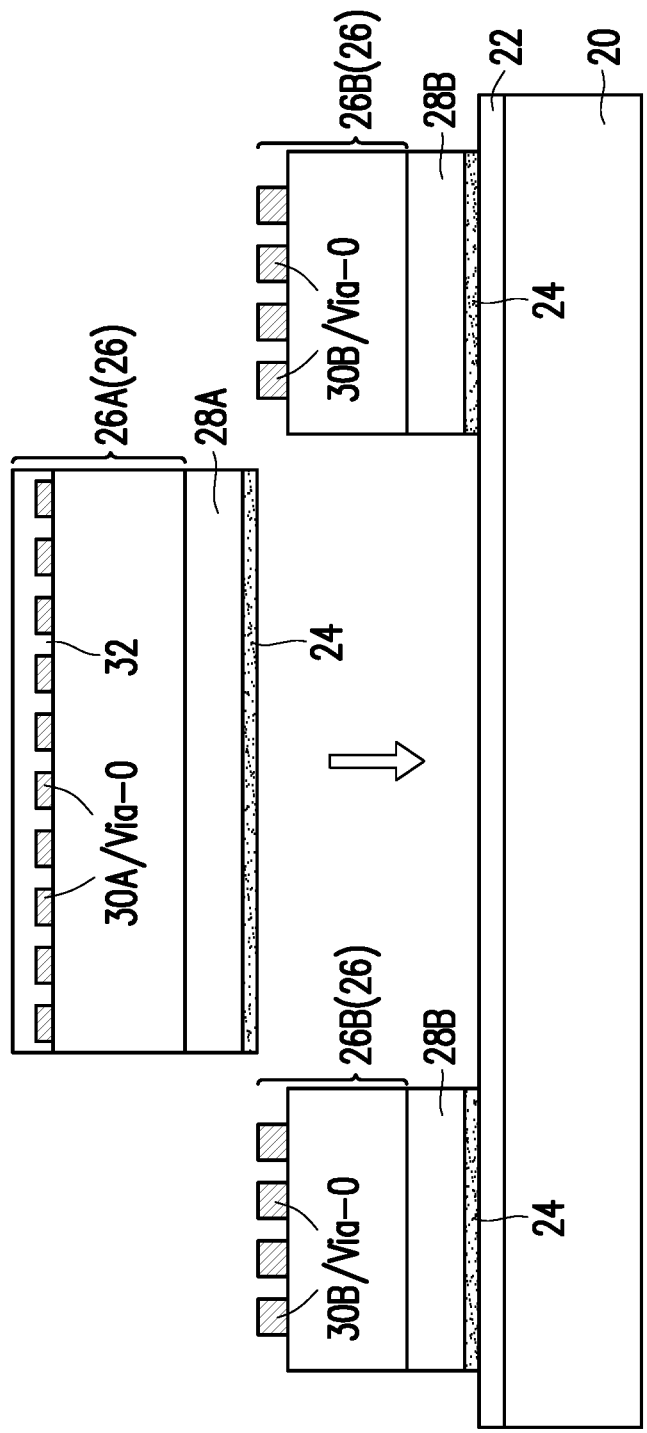
FIGS. 1 through 10 illustrate the cross-sectional views of intermediate stages in the formation of a fan-out package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fan-out package and the method of forming the same are provided in accordance with various embodiments. The intermediate stages of forming the fan-out package are illustrated in accordance with some embodiments. Some variations of some embodiments are discussed. Throughout the various views and illustrative embodiments, like reference numbers are used to designate like elements. In accordance with some embodiments, the fan-out package includes multi-via connections (via groups) for improving reliability, and the stress of the resulting connections is reduced.

Figure 32:
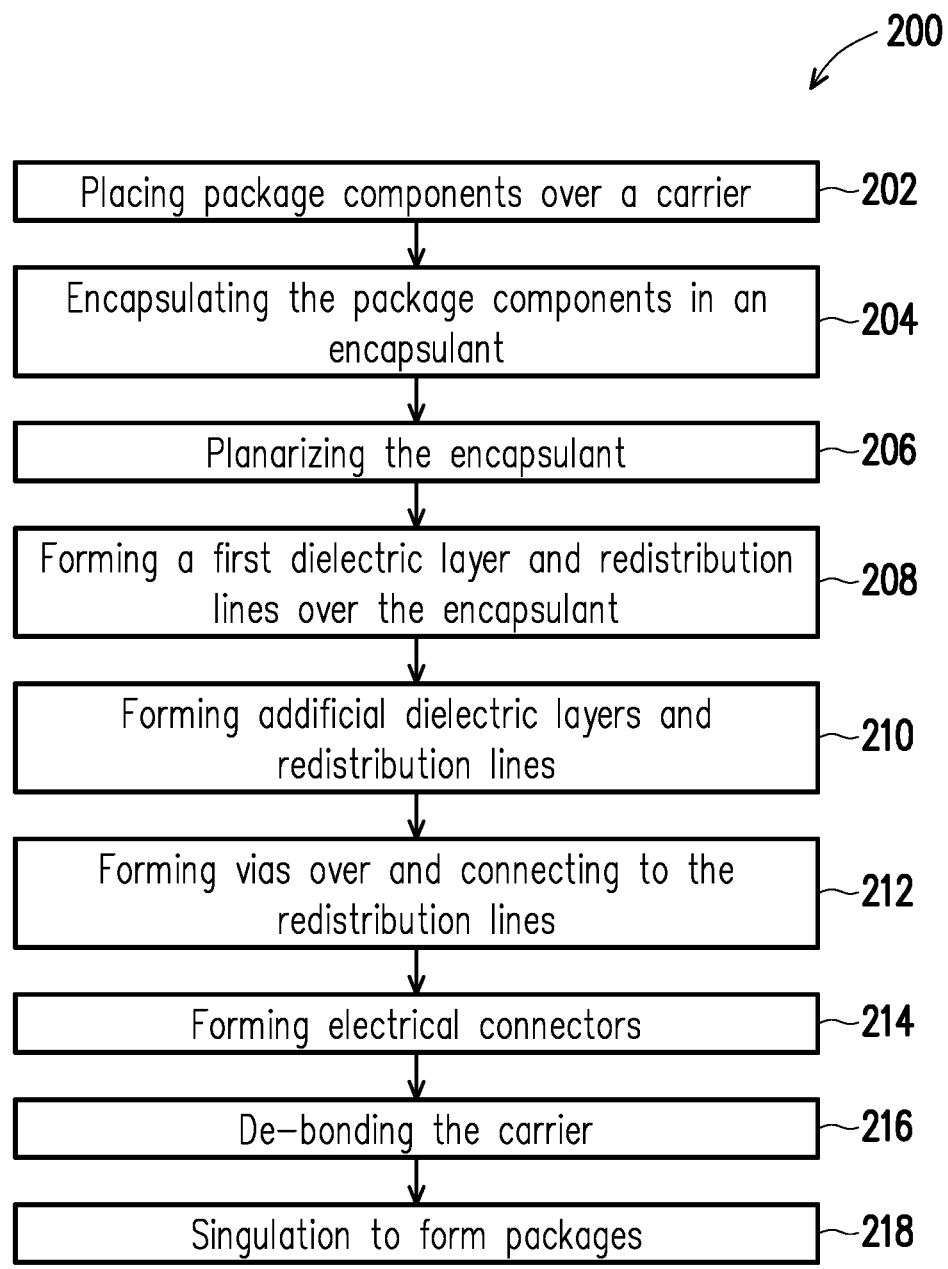
FIG. 32 illustrates a process flow for forming a package in accordance with some embodiments.

FIGS. 1 through 10 illustrate the cross-sectional views of intermediate stages in the formation of a fan-out package in accordance with some embodiments of the present disclosure. The processes shown in FIGS. 1 through 10 are also reflected schematically in the process flow 200 as shown in FIG. 32.

FIG. 1 illustrates carrier 20 and release film 22 formed over carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release film 22 may be formed of a polymer-based material (such as a Light-To-Heat-Conversion (LTHC) material), which may be removed along with carrier 20 from the overlying structures that will be formed in subsequent steps. In accordance with some embodiments of the present disclosure, release film 22 is formed of an epoxy-based thermal-release material. In accordance with some embodiments of the present disclosure, release film 22 is formed of a ultra-violet (UV) glue.

FIG. 1 further illustrates the placement of package components 26 (including 26A and 26B) over carrier 20. The respective process is illustrated as process 202 in the process flow shown in FIG. 32. Package components 26 may be adhered to release film 22 through Die-Attach Films (DAFs) 24, which are adhesive films. In accordance with some embodiments of the present disclosure, package components 26 include System-on-Chip (SoC) dies, memory dies, packages (including device dies that have already been packaged), die stacks such as High-Bandwidth Memory (HBM) blocks, or the like.

In accordance with some embodiments of the present disclosure, the formation of the package is at wafer-level. Accordingly, a plurality of groups of package components are placed, with the groups of package components being identical to each other. Each of the groups may include a plurality of package components 26, which may be identical to each other or different from each other.

Package components 26A and 26B may include semiconductor substrates 28A and 28B, respectively, which may be silicon substrates. Integrated circuit devices (not shown) may be formed on semiconductor substrates 28A and 28B. The integrated circuit devices may include active devices such as transistors and diodes, and may or may not include passive devices such as resistors, capacitors, inductors, or the like. Package components 26A and 26B may include electrical connectors 30A and 30B, respectively, which may be metal pillars, metal pads, or the like. Electrical connectors 30A and 30B are electrically coupled to the integrated circuit devices in the respective package components. Metal pillars 30 may or may not be embedded in a dielectric layer, which may be formed of polybenzoxazole (PBO), polyimide, benzocyclobutene (BCB), or the like. For example, FIG. 1 illustrates that metal pillars 30A is embedded in dielectric layer 32. Some metal pillars (such as 30B) may be exposed rather than being covered by a dielectric layer. Metal pillars 30A and 30B are alternatively referred to as vias via-0.

Figure 2:
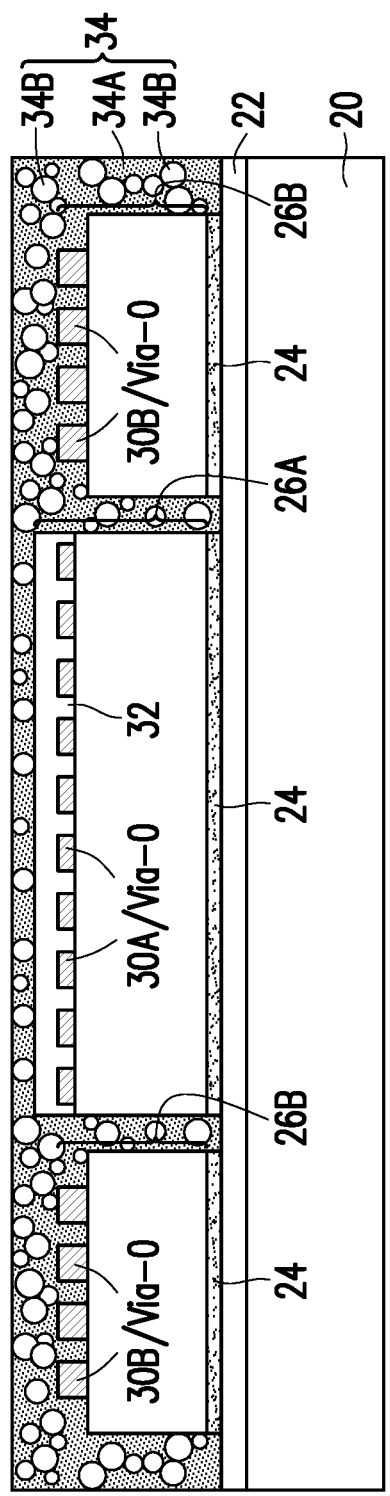

Next, referring to FIG. 2, encapsulant 34 is encapsulated (sometimes referred to as molded) on package components 26A and 26B. The respective process is illustrated as process 204 in the process flow shown in FIG. 32. Encapsulant 34 fills the gaps between neighboring package components 26A and 26B. Encapsulant 34 may include a molding compound, a molding underfill, or the like. Encapsulant 34 may include base material 34A, which may be a polymer, an epoxy, and/or a resin, and filler particles 34B mixed in base material 34A. The filler particles 34B may be formed of silica, aluminum oxide, or the like, and may have spherical shapes. The top surface of encapsulant 34 is higher than the top ends of metal pillars 30A and 30B.

Figure 3:
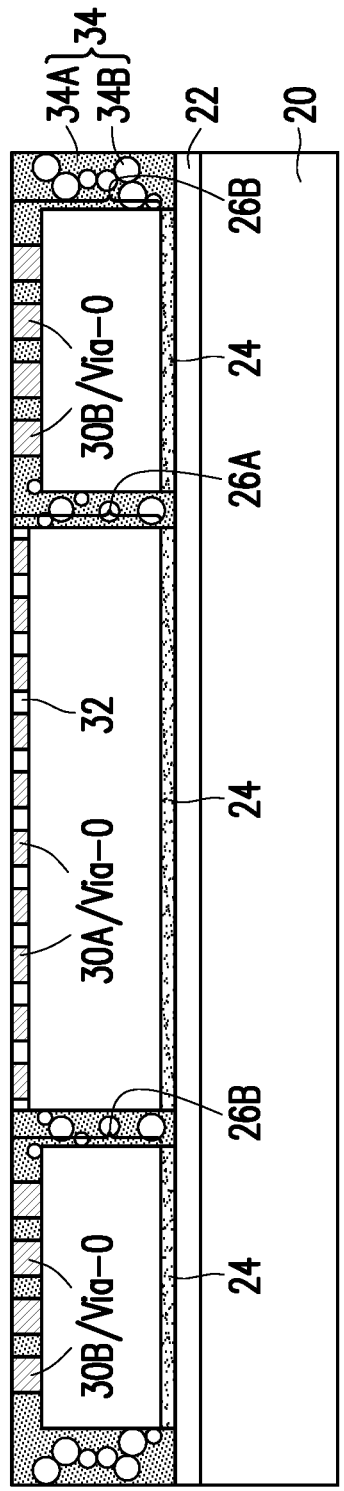

In a subsequent step, as shown in FIG. 3, a planarization process such as a Chemical Mechanical Polish (CMP) process or a mechanical grinding process is performed. The respective process is illustrated as process 206 in the process flow shown in FIG. 32. The top surface of encapsulant 34 is reduced, until metal pillars 30A and 30B are exposed. Due to the planarization, the top surfaces of metal pillars 30A and 30B are substantially coplanar with the top surface of encapsulant 34.

Figure 4:
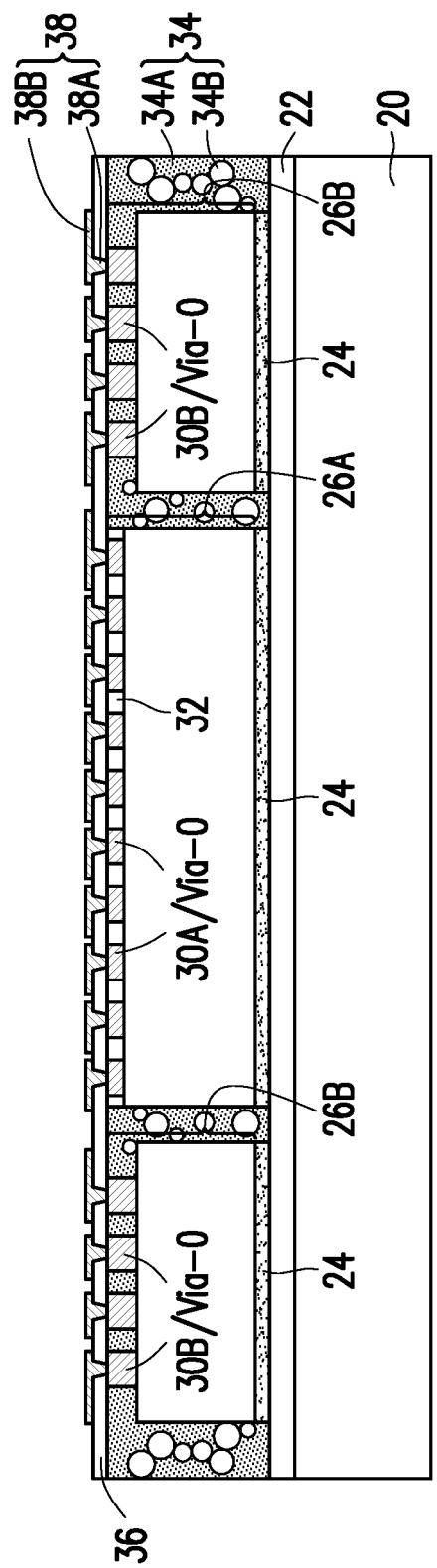
Figure 5:
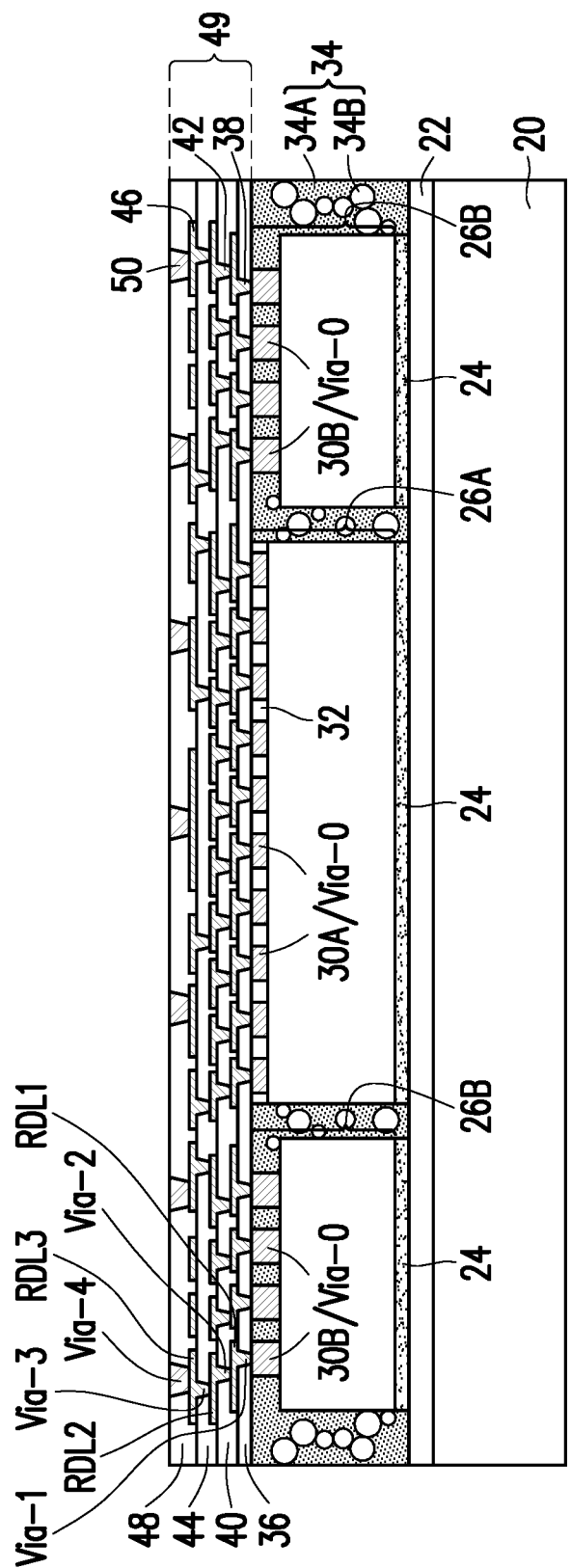

FIGS. 4 and 5 illustrate the formation of front-side Redistribution Lines (RDLs) and the respective dielectric layers. Referring to FIG. 4, dielectric layer 36 is formed. The respective process is illustrated as process 208 in the process flow shown in FIG. 32. In accordance with some embodiments of the present disclosure, dielectric layer 36 is formed of a polymer such as PBO, polyimide, or the like. In accordance with alternative embodiments of the present disclosure, dielectric layer 36 is formed of an inorganic material such as silicon nitride, silicon oxide, or the like.

RDLs 38 are then formed to electrically connect to metal pillars 30A and 30B. The respective process is also illustrated as process 208 in the process flow shown in FIG. 32. In accordance with some embodiments of the present disclosure, the formation of RDLs 38 include forming openings in dielectric layer 36 to reveal metal pillars 30A and 30B, forming a blanket copper seed layer, forming and patterning a mask layer over the blanket copper seed layer, performing a plating to form RDLs 38, removing the mask layer, and etching the portions of the blanket copper seed layer not covered by RDLs 38. RDLs 38 may be formed of a metal or a metal alloy including titanium, copper, aluminum, tungsten, and/or alloys thereof. RDLs 38 include via portions 38A in dielectric layer 36, and trace portions 38B over dielectric layer 36. The trace portions may include narrow portions and wide portions, wherein the wide portions may act as metal pads. RDLs 38 may interconnect package components 26A and 26B.

Referring to FIG. 5, in accordance with some embodiments of the present disclosure, more dielectric layers and the corresponding layers of RDLs are formed. The respective process is illustrated as process 210 in the process flow shown in FIG. 32. It is appreciated that depending on the design requirement, the layers of dielectric and RDLs may be more or less than what are illustrated. In accordance with some embodiments, dielectric layers 40, 44, and 48 are formed using the materials selected from the similar group of candidate materials for forming dielectric layer 36. RDLs 42 and 46 are formed to electrically couple to package components 26A and 26B through RDLs 38. Vias 50 are also formed in dielectric layer 48 to connect to RDLs 46. RDLs 42 and 46 and vias 50 may be formed using similar materials and methods for forming RDLs 38. A planarization process may be performed to level the top surfaces of vias 50 and dielectric layer 48. Dielectric layers 36, 40, 44, and 48 and RDLs 38, 42, and 46, and vias 50 in combination form interconnect structure 49.

In accordance with some embodiments of the present disclosure, metal pillars 30A and 30B are alternatively referred to as via-0 since they are the vias below interconnection structure 49. The via portions of RDLs 38 are alternatively referred to as vias via-1, and the trace portions of RDLs 38 are alternatively referred to as RDL traces RDL1. The via portions of RDLs 42 are alternatively referred to as vias via-2, and the trace portions of RDLs 42 are alternatively referred to as RDL traces RDL2. The via portions of RDLs 46 are alternatively referred to as vias via-3, and the trace portions of RDLs 46 are alternatively referred to as RDL traces RDL3. Vias 50 are formed over and connecting to the underlying RDLs. The respective process is illustrated as process 212 in the process flow shown in FIG. 32. Vias 50 are alternatively referred to as vias via-4 or top vias. It is appreciated that the numbering of vias and traces as 0, 1, 2, 3, and 4 are for the purpose of identifying relative positions, and more or fewer layers are also contemplated.

Figure 6:
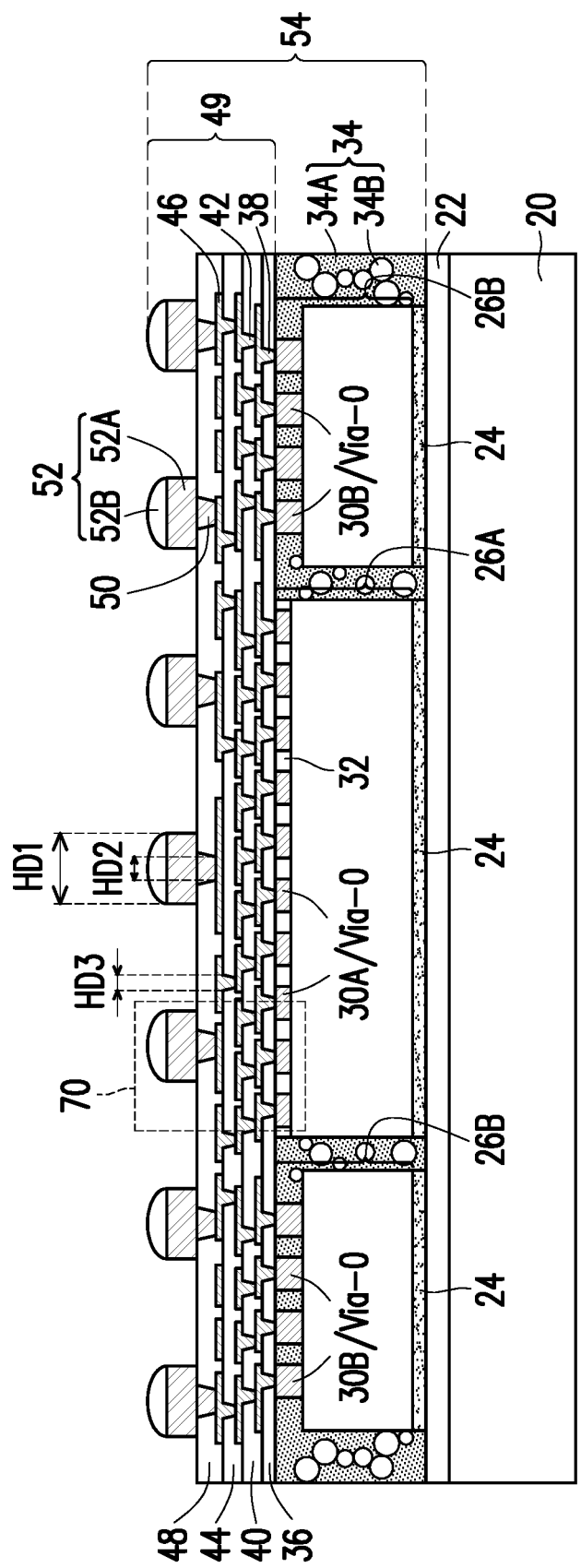

FIG. 6 illustrates the formation of electrical connectors 52. The respective process is illustrated as process 214 in the process flow shown in FIG. 32. In accordance with some embodiments, electrical connectors 52 include metal pillars 52A and solder regions 52B over metal pillars 52A. The formation of electrical connectors 52 may include forming metal pillars 52A using plating, placing solder balls on the exposed portions of the metal pillars 52A, and then reflowing the solder balls to form solder regions 52B. In accordance with alternative embodiments of the present disclosure, the formation of electrical connectors 52 includes performing plating steps to form metal pillars 52A and solder regions over the metal pillars 52A, and then reflowing the plated solder regions to form solder regions 52B. Electrical connectors 52 and vias 50 may or may not have distinguishable interfaces.

Metal pillars 52A are also alternatively referred to as Under-Bump Metallurgies (UBMs) 52A. In accordance with some embodiments, UBMs 52A have horizontal dimensions (such as lengths, widths, or diameters) HD1 significantly greater than the horizontal dimensions HD2 of vias 50. For example, ratio HD1/HD2 may be greater than about 3 or greater than about 5, and may be in the range between about 3 and about 10. The horizontal dimensions HD2 are also significantly greater than the horizontal dimensions HD3 of vias via-1, via-2 and via-3. For example, ratio HD2/HD3 may be greater than about 2 or greater than about 5, and may be in the range between about 3 and about 10. Throughout the description, package components 26A and 26B, encapsulant 34, and the overlying interconnection structure 49 are in combination referred to as reconstructed wafer 54.

Figure 7:
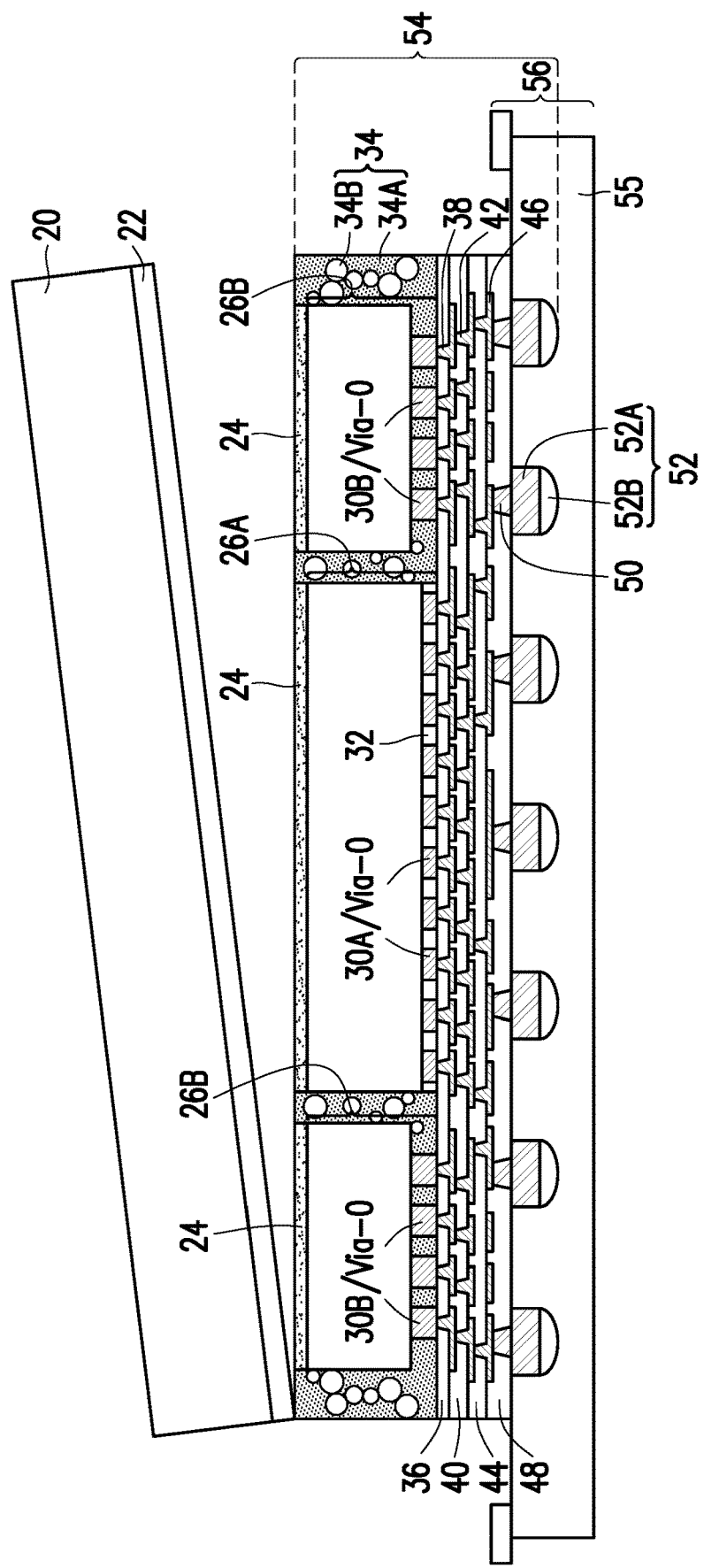
Figure 8:
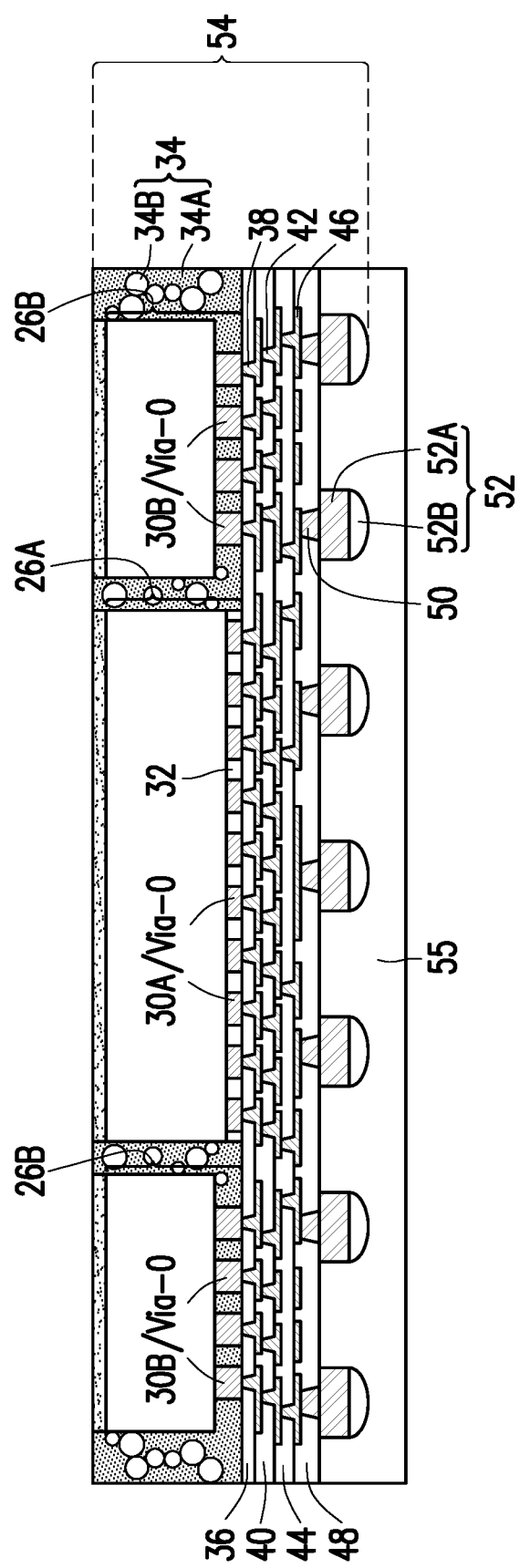

Next, referring to FIG. 7, reconstructed wafer 54 is placed on frame 56, with electrical connectors 52 adhered to the tape 55 in frame 56. Reconstructed wafer 54 is then de-bonded from carrier 20, for example, by projecting a UV light or a laser beam on release film 22, so that release film 22 decomposes under the heat of the UV light or the laser beam. Reconstructed wafer 54 is thus de-bonded from carrier 20. The respective process is illustrated as process 216 in the process flow shown in FIG. 32. The resulting reconstructed wafer 54 is shown in FIG. 8. A frame cut is then performed to remove the outer portions of frame 56. A backside grinding may (or may not) be performed to remove DAFs 24 (FIG. 7), if they are used, so that the surface of encapsulant 34 are coplanar with the back surfaces of package components 26A and 26B.

Figure 9:
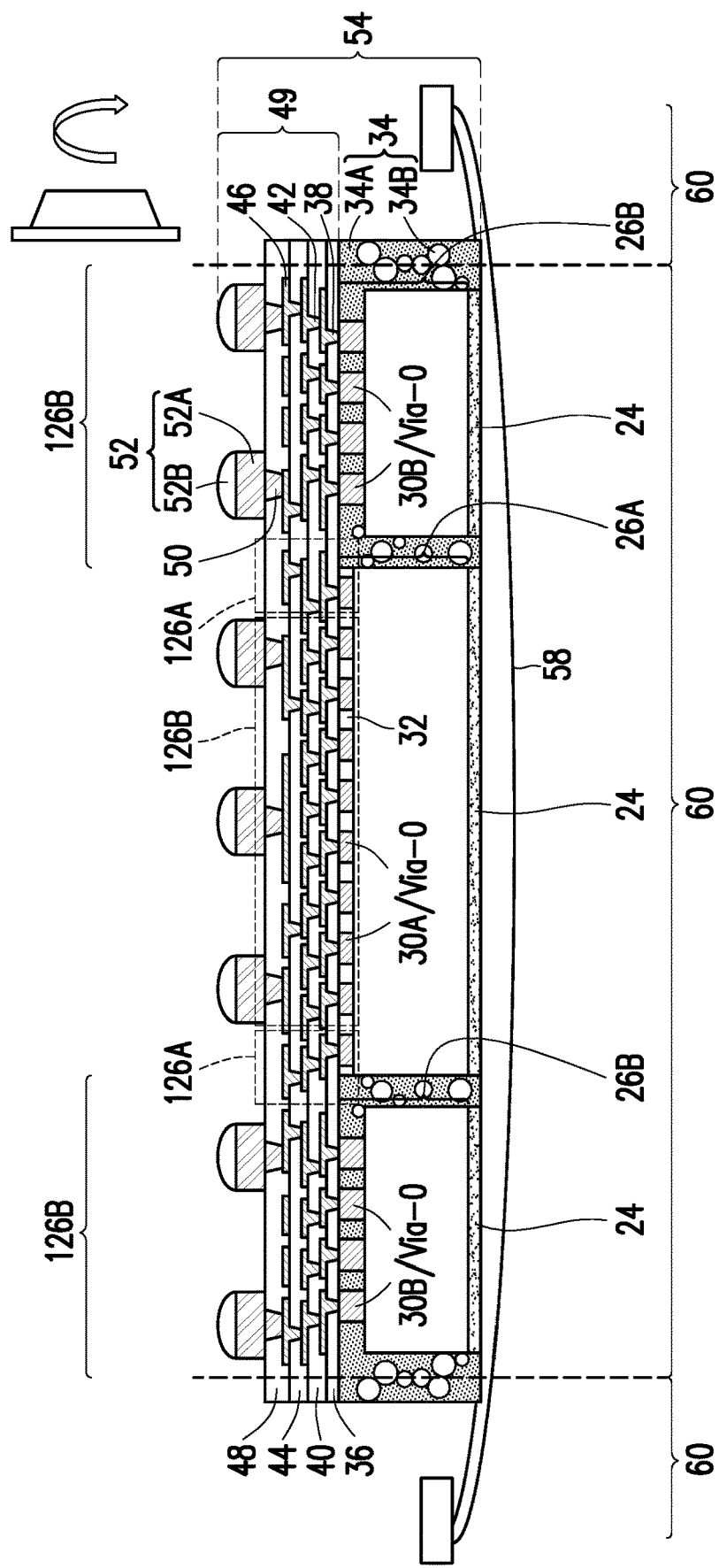
Figure 25:
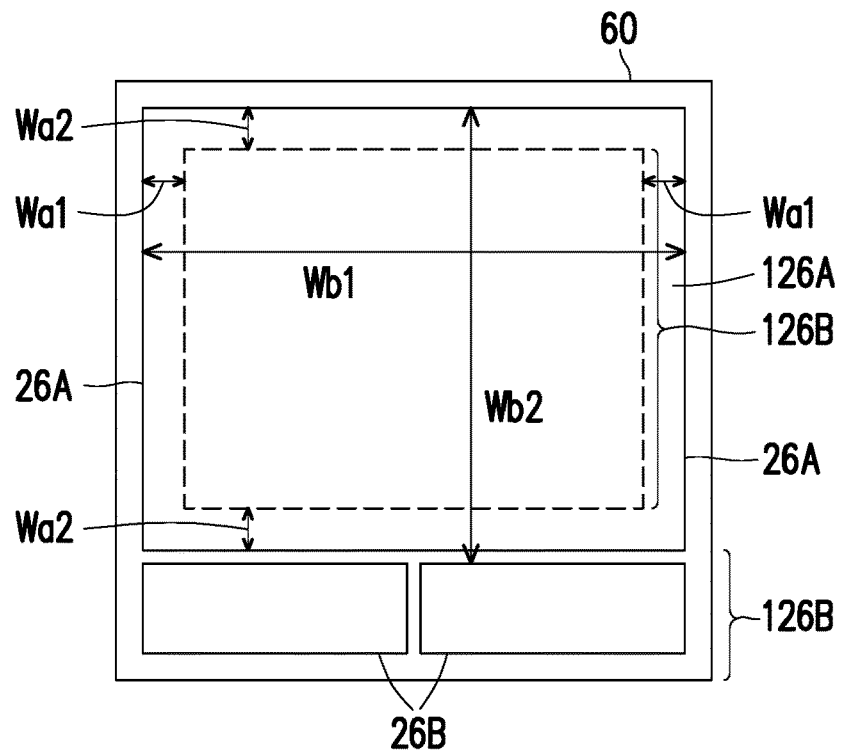
FIGS. 25 and 26 illustrate the layout of some fan-out packages in accordance with some embodiments.
Figure 26:
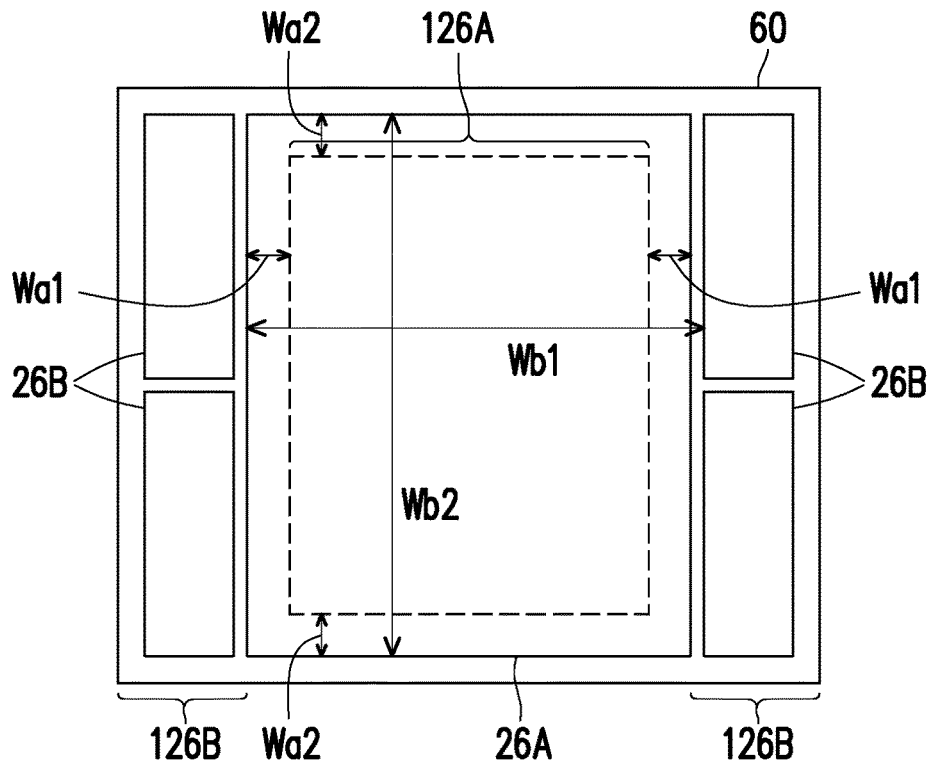

Referring to FIG. 9, reconstructed wafer 54 is placed on dicing gap 58, and tape 55 (FIG. 8) is removed. Reconstructed wafer 54 is then singulated into a plurality of packages 60, which may be identical to each other. The respective process is illustrated as process 218 in the process flow shown in FIG. 32. FIGS. 25 and 26 illustrate the top views of some packages 60 in accordance with some embodiments.

Figure 10:
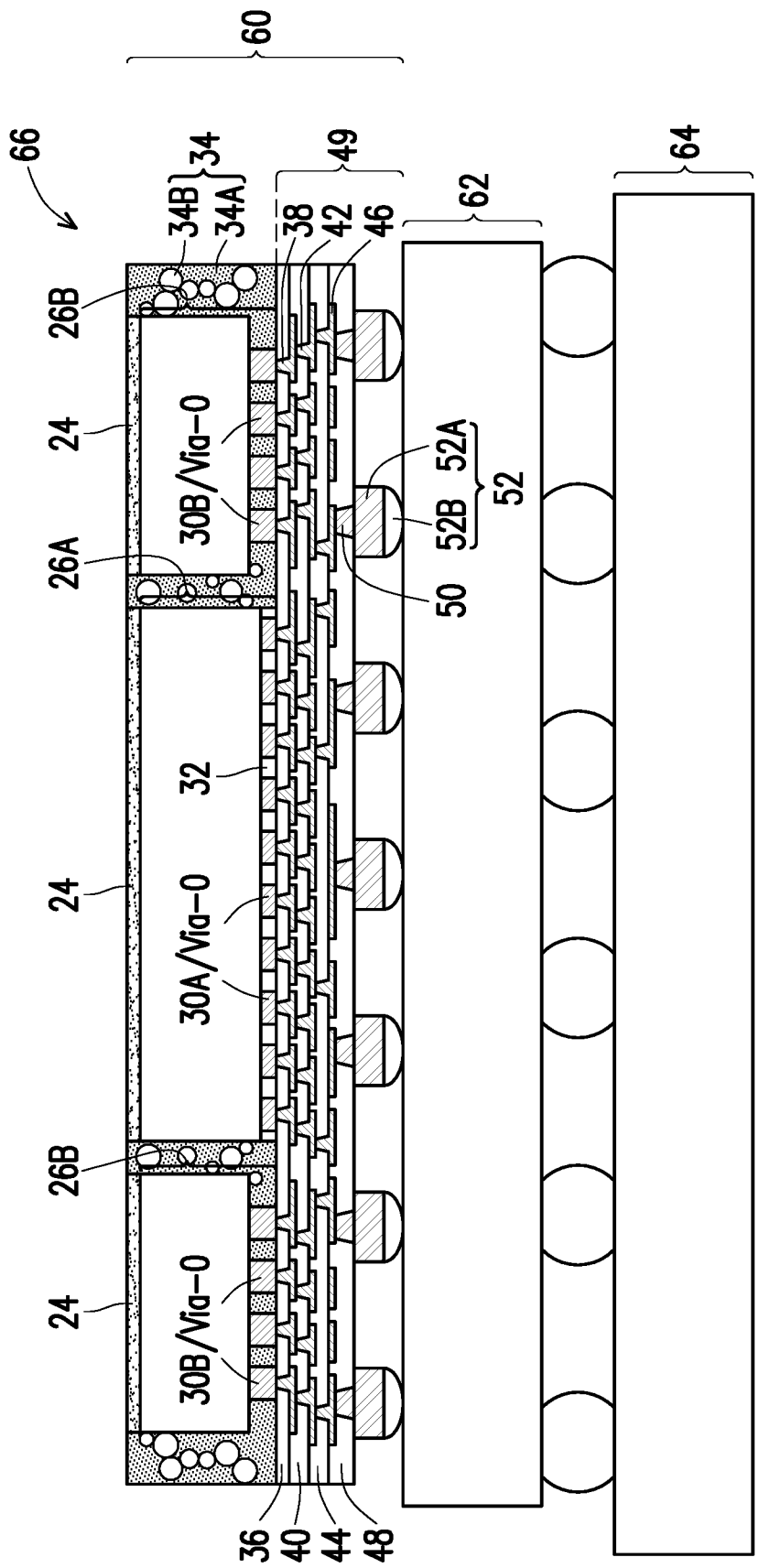

FIG. 10 illustrates package 66 formed using package 60. For example, package component 62 is bonded with package 60 through flip-chip bonding. Package component 62 may be a package substrate, an interposer, or the like. Package component 62 may further be bonded to package component 64, which may be a package substrate, a printed circuit board, or the like.

Figure 11:
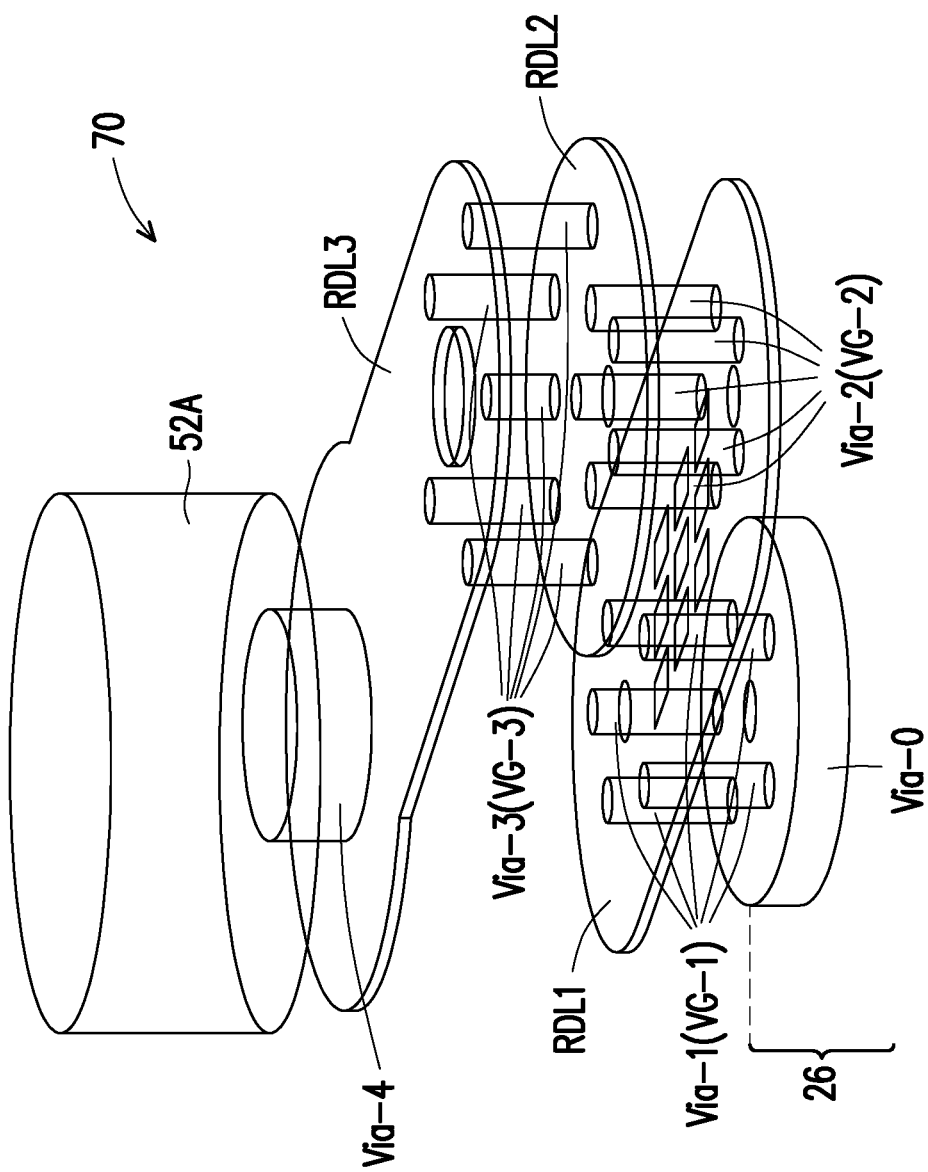
FIG. 11 illustrates a perspective view of a non-ground-up connection structure in accordance with some embodiments.

FIG. 11 illustrates a perspective view of non-ground-up connection structure 70 in accordance with some embodiments. The non-ground-up connection structure 70 is a part of interconnect structure 49 in FIG. 9. An example of wherein a non-ground-up connection structure 70 is located is also shown in FIG. 6. As shown in FIG. 11, a plurality layers of RDL traces RDL1, RDL2, and RDL3 and a plurality of vias via-1, via-2, and via-3 are connected to UBM 52A to form non-ground-up connection structure 70. The term "non-ground-up" indicates that at least some of the vias via-1, via-2, and via-3 (as groups) are vertically misaligned with (shifted away from) the respective overlying via via-4. In accordance with some embodiments of the present disclosure, the connection between two neighboring RDL traces are through a via group (rather than a single via), so that the resulting structure is more resistant to the stress in the resulting package. As shown in FIG. 11, the via groups are also referred to as VG-1, VG-2, and VG-3, with each of the via groups including a plurality of vias, which are referred to individually and collectively as vias via-1, vias via-2, and vias via-3 also. Each of the via groups may include 2, 3, 4, 5, or more vias.

As shown in FIG. 11, there may be a single via via-4 underlying and connected to UBM 52A. RDL trace RDL3 is underlying and connected to via via-4, and redistributes the connection from a region directly underlying UBM 52A to a region not directly underlying UBM 52A. Via group VG-3 connects RDL trace RDL3 to RDL trace RDL2, which is over and contacting via group VG-2. RDL trace RDL1 is connected to via group VG-2, and is over and contacting via group VG-1. Via group VG-1 may be connected to via(s) via-0, which is a part of the underlying package component 26.

In accordance with some embodiments, the adoption of a via group rather than a single via to connect a RDL trace to a respective underlying RDL trace may improve reliability. In addition, shifting at least one, or may be two or three of via groups VG-1, VG-2, and VG-3 from the region directly underlying UBM 52A results in the reduction of stress, and hence the trace distortion caused by the stress is reduced, and the reliability of the resulting package is improved.

Figure 12A:
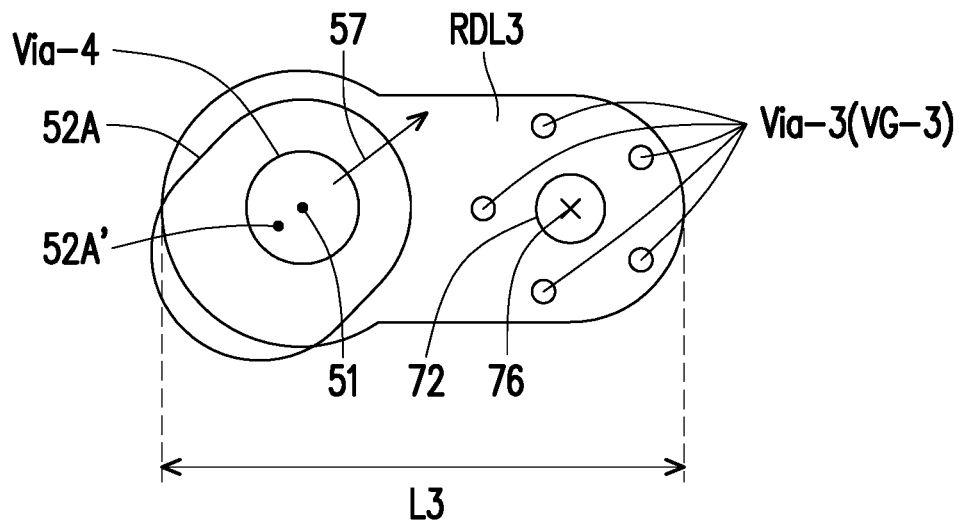
FIGS. 12A, 12B, and 12C illustrate the top views of various conductive traces (pads) in a non-ground-up connection structure in accordance with some embodiments.

FIG. 12A illustrates a top view of UBM 52A, via via-4, RDL trace RDL3, and vias via-3 (and the corresponding via group VG-3) in accordance with some embodiments. Via group VG-3 is shifted away from the region underlying UBMs 52A and via-4, with no portion of via group VG-3 overlapped by UBM 52A and via-4. Throughout the description, when vias or via groups are referred to as being "shifted away" from the overlying features, it means that the center of the via groups are shifted in a lateral direction for a distance, so that the center of the via groups and the center of the overlying feature are not aligned to a same vertical line. Throughout the description, the term "center" may also means "centroid." In accordance with some embodiments, UBM 52A has an elongated shape, and the center 52A' is shifted away from center 51 of via-4. Furthermore, arrow 57 points to the direction of the center of the respective fan-out package 60, and center 52A' is shifted away from the center of the respective fan-out package 60 than center 51 of via via-4. RDL trace RDL3 may have hole 72, which is formed in order to reduce the density of the RDLs, and hole 72 is also a degassing hole. Although one hole 72 is illustrated, there may be more holes formed in RDL trace RDL3, which holes are filled with dielectric materials of the corresponding dielectric layer. The shape of hole(s) 72 may be circular, rectangular, or other shapes. Vias Via-3 may be aligned to a circle encircling hole 72.

Figure 12B:
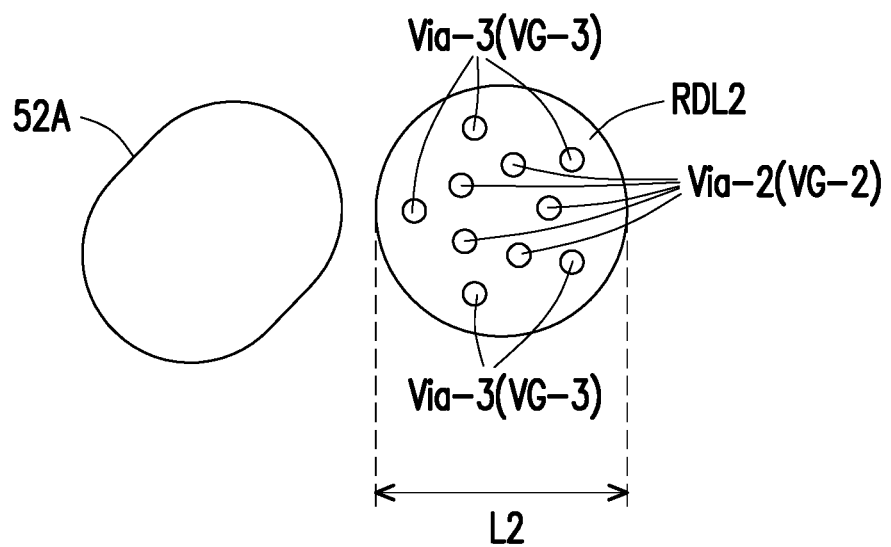

FIGS. 12B illustrates a top view of UBM 52A, RDL trace RDL2, and vias via-2 (and the corresponding via group VG-2) in accordance with some embodiments. Via group VG-2 is also shifted away from the region directly underlying UBM 52A, with no portion of via group VG-2 overlapped by UBM 52A and via via-4.

Figure 12C:
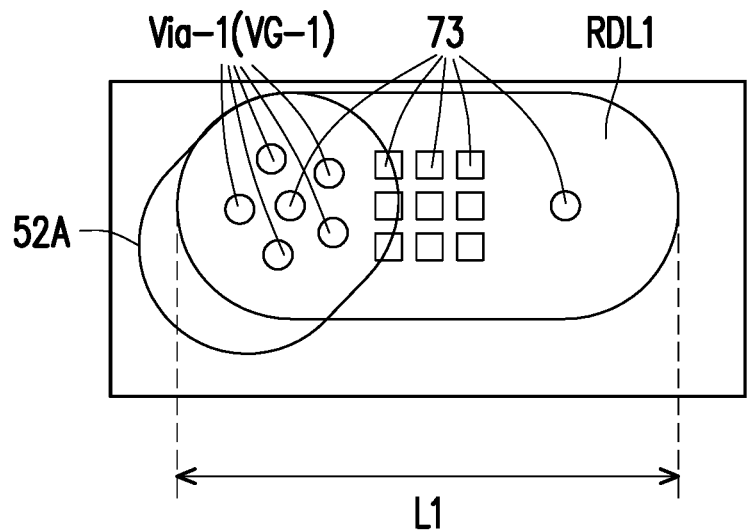

FIG. 12C illustrates a top view of UBM 52A, RDL trace RDL1, and vias via-1 (and the corresponding via group VG-1) in accordance with some embodiments. Via group VG-1 may be in the region directly underlying UBM 52A, and may or may not be in the region directly underlying via via-4. RDL trace RDL1 may have holes 73, which are degassing holes.

As shown in FIGS. 12A, 12B, and 12C, the non-ground-up connection structure 70 has at least one via group (such as VG-2 and VG-3 in FIG. 12A) vertically misaligned with (shifted away from) UBM 52A and via via-4. In accordance with some embodiments, via group VG-1 may be misaligned with, or overlapped by, the overlying via group VG-2, and via group VG-2 may be misaligned with, or overlapped by, the overlying via group VG-3. Throughout the description, a first via group is referred to as overlapping a second via group if the contour area of the first via group has at least a portion overlapping a portion of the second via group, wherein the "contour area" is explained referring to FIGS. 13B, 13C, and 13D. For example, as shown in FIG. 12A, via group VG-3 overlaps via group VG-2. In accordance with some embodiments of the present disclosure, when a first via group overlaps a second via group, the vias in the first via group may be designed to be misaligned with the vias in the second via group. For example, vias via-2 are illustrated in FIG. 12A to show that via group VG-3 overlaps via group VG-2, but vias via-3 are misaligned with vias via-2. In accordance with some embodiments, vias via-2 are aligned to a smaller (or larger) ring than the ring that vias via-3 are aligned to, so that vias via-2 are not overlapped by the corresponding vias via-3. In accordance with other embodiments, as shown in FIG. 12A, via group VG-2 is rotated relative to via group VG-3 around centers 76 of via groups VG-2 and VG-3, so that underlying vias (such as vias via-2) are not overlapped by the overlying vias (such as via-3). Furthermore, vias via-2 are rotational symmetric about center 76, which means they are aligned to a same circle having 76 as its centroid, and they have equal distance. Vias via-3 may also be rotational symmetric about center 76. In accordance with some embodiments, none of the vias via-1, via-2 and via-3 is overlapped by or overlaps any other via in the same non-ground-up connection structure 70. In accordance with other embodiments, none of the vias via-1, via-2 and via-3 is overlapped by the immediate overlying vias, and none of the vias overlaps immediate underlying vias. However, if two layers of vias are not in immediate neighboring via-layers, the overlying vias may or may not overlap the underlying vias. For example, vias via-3 may not overlap vias via-2, but may or may not overlap vias via-1.

Figure 13A:
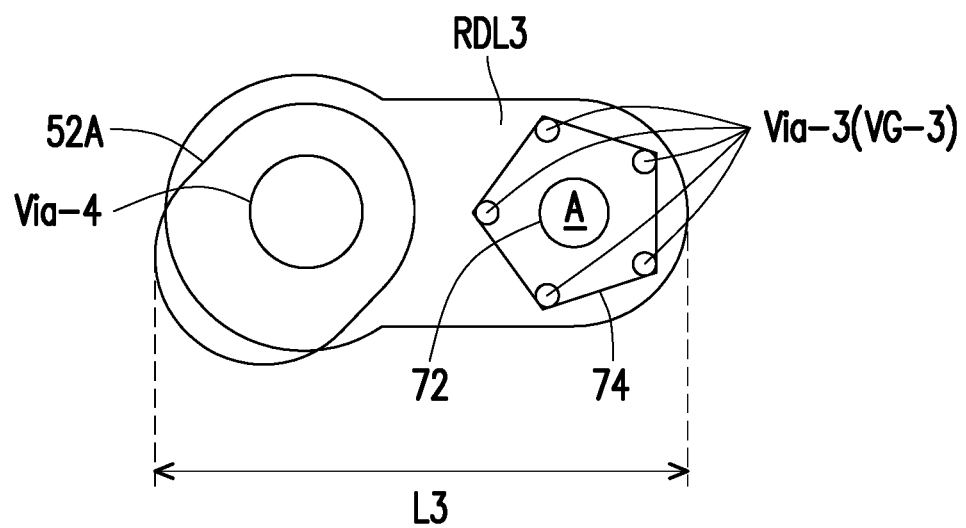
FIGS. 13A, 13B, 13C and 13D illustrate the top views of vias and corresponding contour areas in non-ground-up connection structures in accordance with some embodiments.
Figure 13D:
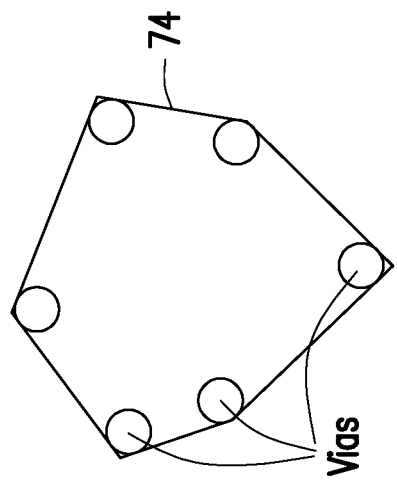
Figure 13C:
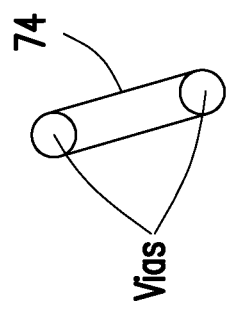
Figure 13B:
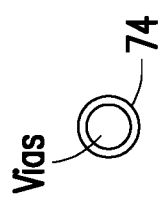

Each via or via group occupies a contour area, as shown in FIGS. 13A, 13B, 13C, and 13D, and the contour area of the via group is the area occupied by the vias in the via group and the polygon connecting the vias. For example, FIG. 13A illustrates the contour area 74 occupied by a five-via via group, FIG. 13C illustrates the contour area 74 occupied by a two-via via group, and FIG. 13D illustrates the contour area 74 occupied by a six-via via group. FIG. 13B illustrates the contour area 74 occupied by a single-via. In accordance with some embodiments of the present disclosure, as shown in the top view in FIG. 13A, the center of contour area 74 of via group VG-3 is shifted away from the center of via via-4. Furthermore, contour area 74 does not have any portion overlapped by via via-4. Shifting the center of contour area 74 of via group VG-3 away from the center of via via-4, but still allows via-4 to overlap a part of contour area 74 may generate a high stress in the resulting structure. Accordingly, in accordance with some embodiments, either a via group is not shifted away from via-4, which means that the center of the via group (such as VG-3) is vertically aligned the center of via via-4, or the via group is shifted far enough, so that via-4 does not overlap any portion of the contour area of the via group.

FIGS. 14A and 15 through 18 illustrate the cross-sectional views of some portions of non-ground-up connection structure 70, in which via group VG-3 is shifted away from via via-4 and UBM 52A. Other via groups VG-2 and VG-1 may or may not be overlapped by via via-4. For example, in FIG. 14A, vias via-3 and the corresponding via group VG-3 are shifted away from via-4. Via group VG-2 is overlapped by via group VG-3. Vias via-1 (via group VG-1) may be overlapped by via via-4 and/or UBM 52A.

Figure 14A:
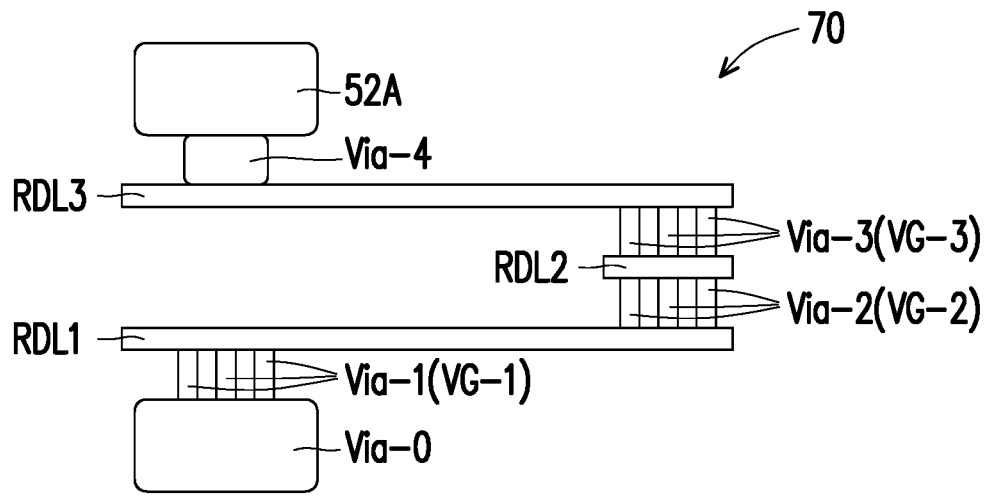
FIGS. 14A, 14B, 14C, 14D, 14E, 15-18, 19A, 19B, 19C, 19D, 20A, 20B, 20C, 21A, 21B, 21C, 22A, 22B, and 22C illustrate cross-sectional views and top views of non-ground-up connection structures in accordance with some embodiments.
Figure 14B:
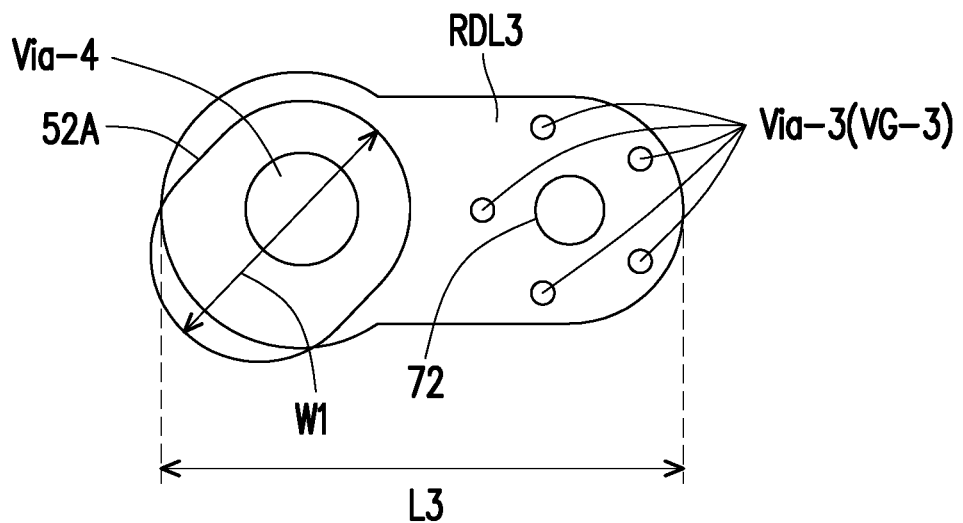
Figure 14C:
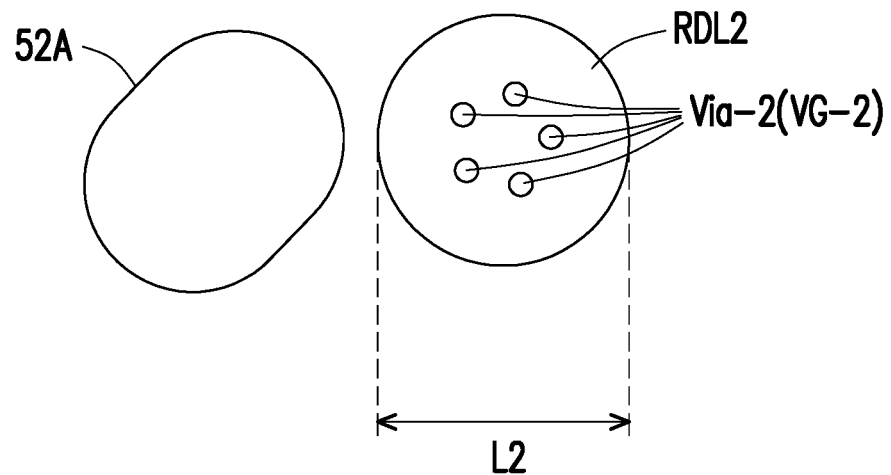
Figure 14D:
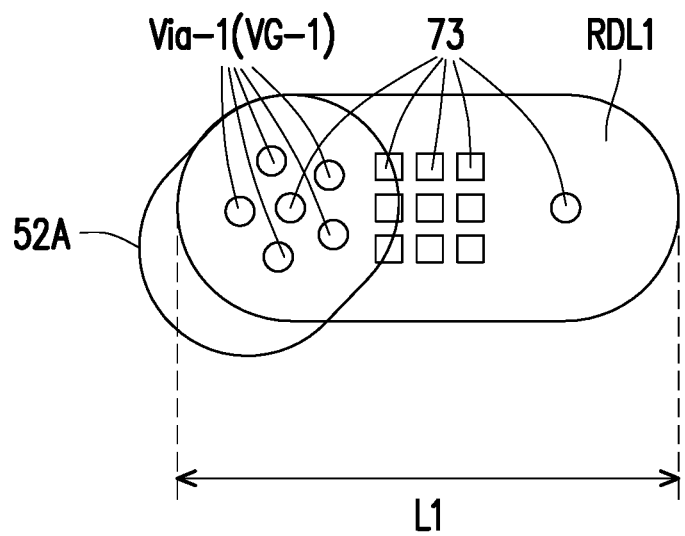
Figure 14E:
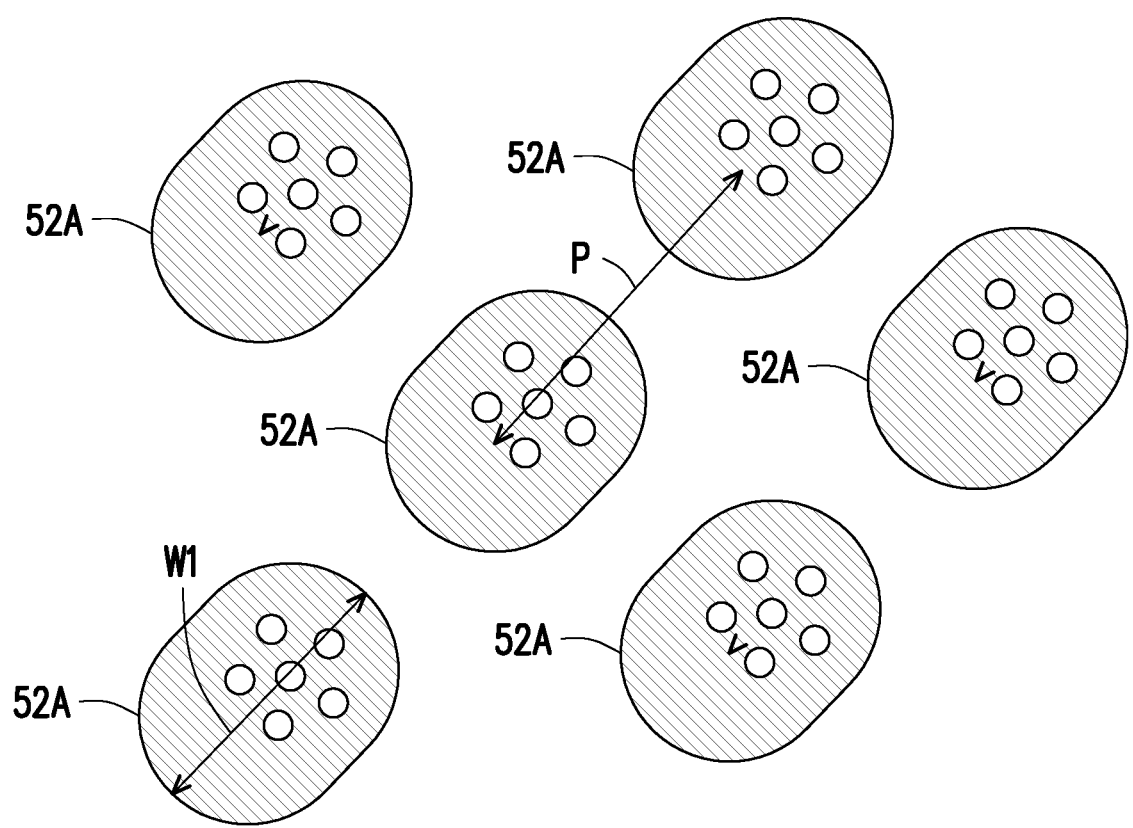

FIGS. 14B, 14C, and 14D illustrate the RDLs RDL3, RDL2, and RDL1 and vias via-4, via-3, via-2 and via-1 as shown in FIG. 14A. The top views may also apply to the embodiments shown in FIGS. 15 through 18. In accordance with some embodiments, UBM 52A has a lateral dimension (width or length) W1, and RDLs RDL3, RDL2, and RDL1 have lengths L3, L2, and L1, respectively. In accordance with some embodiments, each of lengths L1, L2, and L3 is smaller than the square root of 2 times P, wherein P is the pitch of UBMs 52A, as shown in FIG. 14E. Holes 72 (FIG. 14B) and 73 (FIG. 14D) have dimensions smaller than lateral dimension W1 (FIG. 14B) of UBM 52A.

Figure 15:
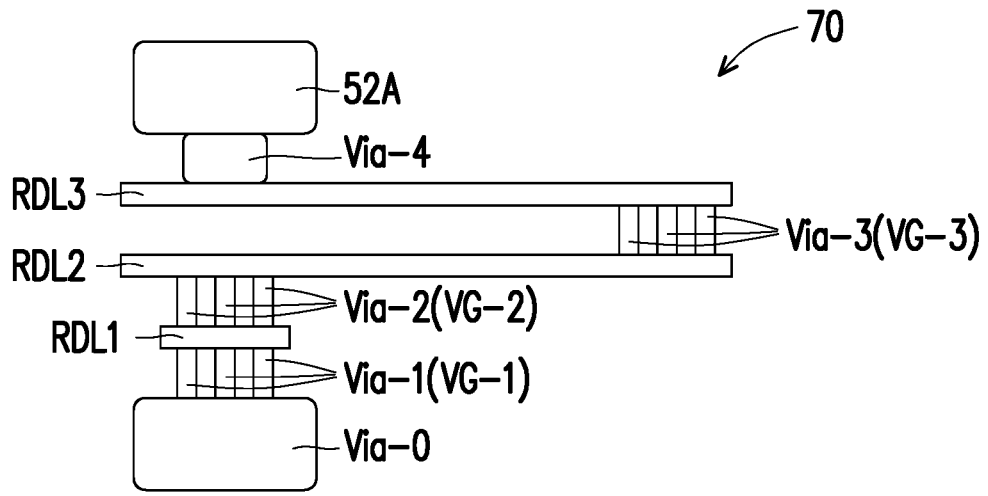

FIG. 15 illustrates that vias via-3 and the corresponding via group VG-3 are shifted away from via-4. Via group VG-2 is also shifted away from via group VG-3. Via group VG-2 is vertically shifted with the overlying via group VG-3, although via group VG-2 overlaps via group VG-1. Via group VG-1 and via group VG-2 may be overlapped by via via-4 and/or UBM 52A.

Figure 16:
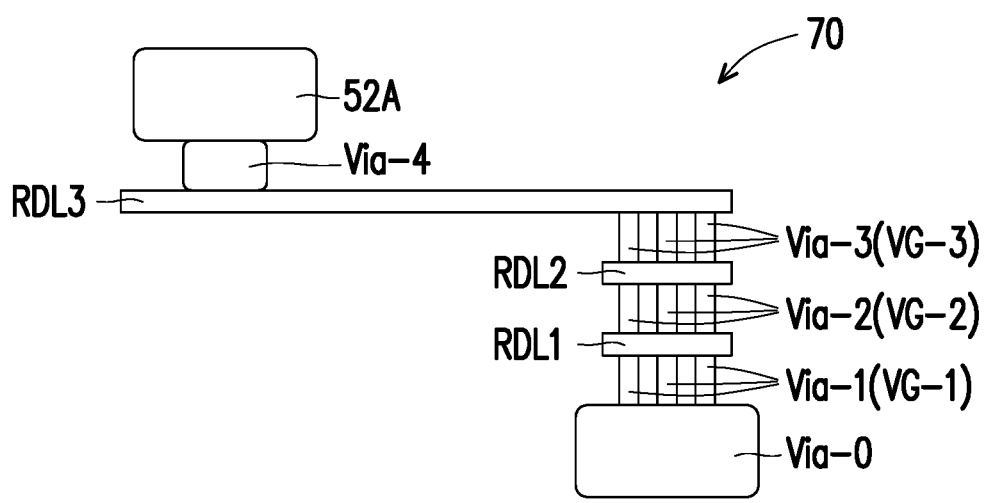

FIG. 16 illustrates that vias via-3 and the corresponding via group VG-3 are shifted away from via-4. Via groups VG-2 and VG-1 are also shifted away from via group via via-4. Via group VG-3 overlaps both via groups VG-2 and VG-1. In accordance with some embodiments of the present disclosure, vias via-1 are vertically shifted with the overlying vias via-2, which are further vertically shifted with the overlying vias via-3.

Figure 17:
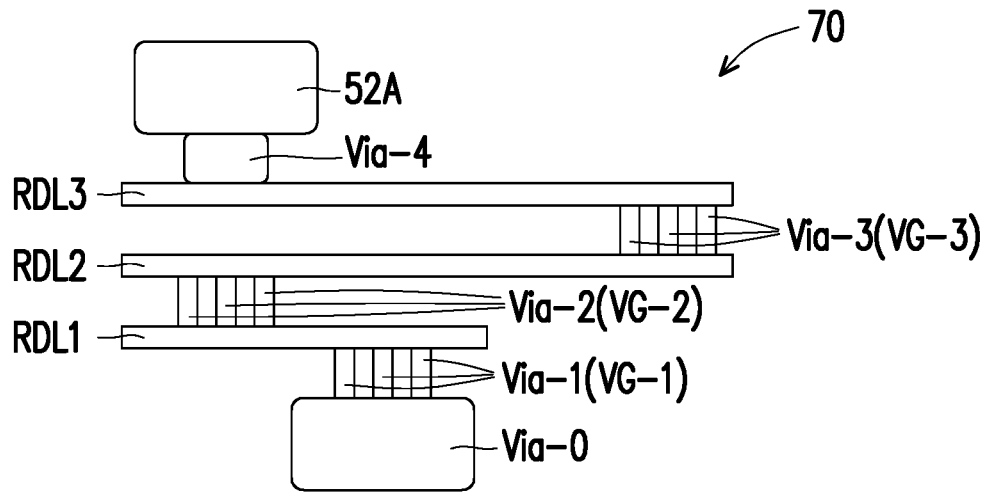

FIG. 17 illustrates that vias via-3 and the corresponding via group VG-3 are shifted away from via via-4. Via group VG-2 is overlapped by via-4 and/or UBM 52A. Vias via-1 and via group VG-1 are not overlapped by any of via group VG-2, via group VG-3, via via-4, and UBM 52A.

Figure 18:
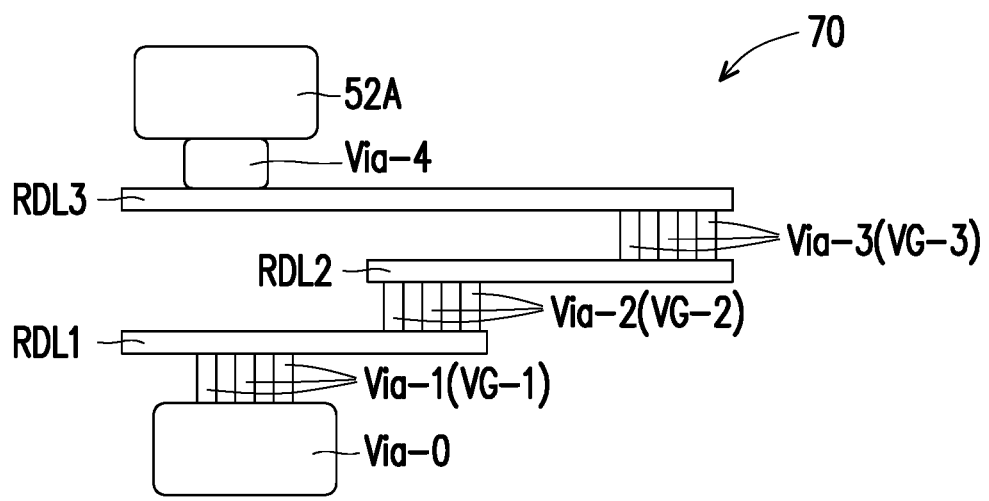

FIG. 18 illustrates that vias via-3 and the corresponding via group VG-3 are shifted away from via-4. Via group VG-2 is also shifted away from via group VG-3. Via group VG-1 is not overlapped by any of via group VG-2 and via group VG-3. Via groups VG-2 and VG-1 may be partially overlapped (not shown in FIG. 18) by via via-4 and UBM 52A.

Figure 19A:
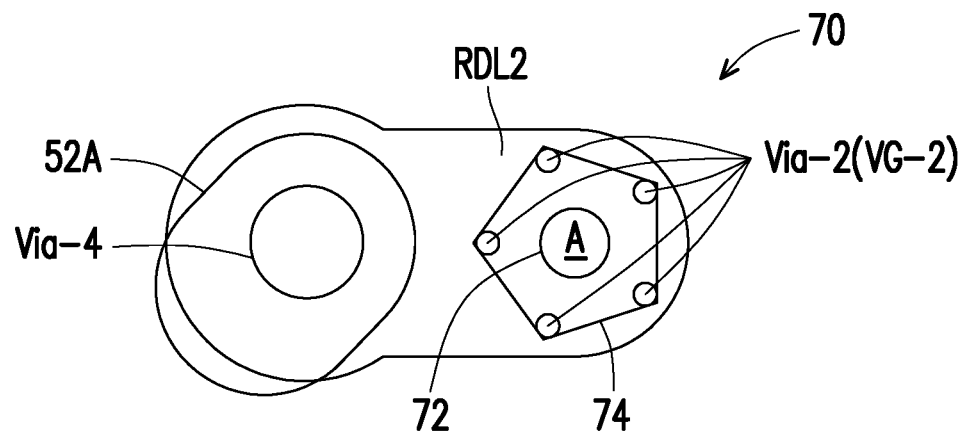
Figure 19B:
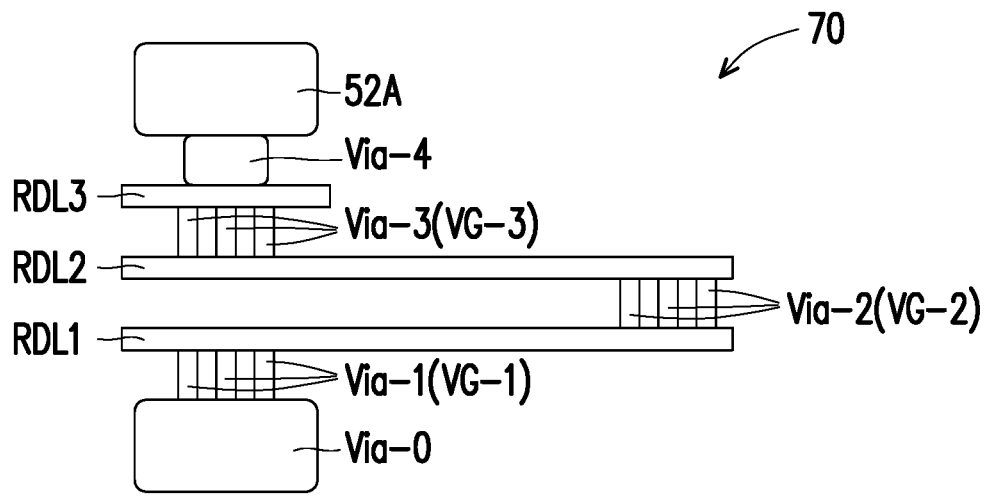
Figure 19C:
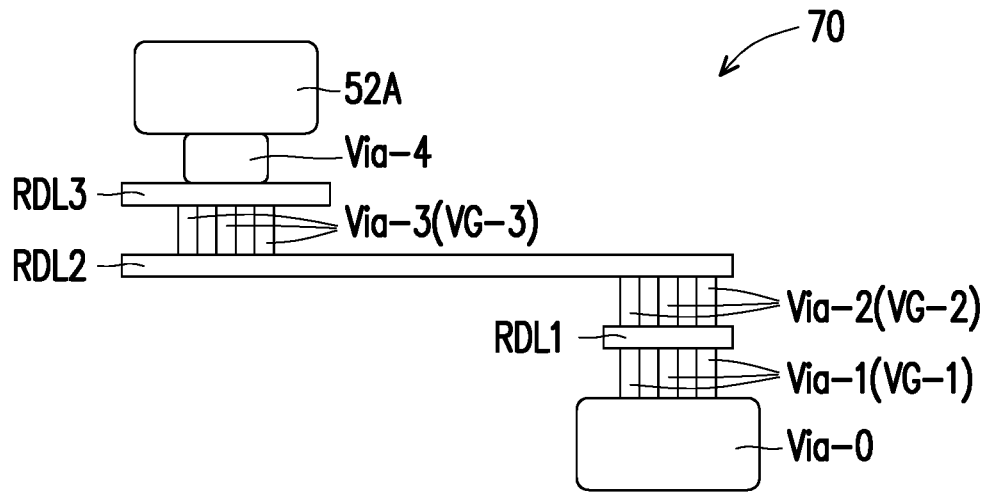
Figure 19D:
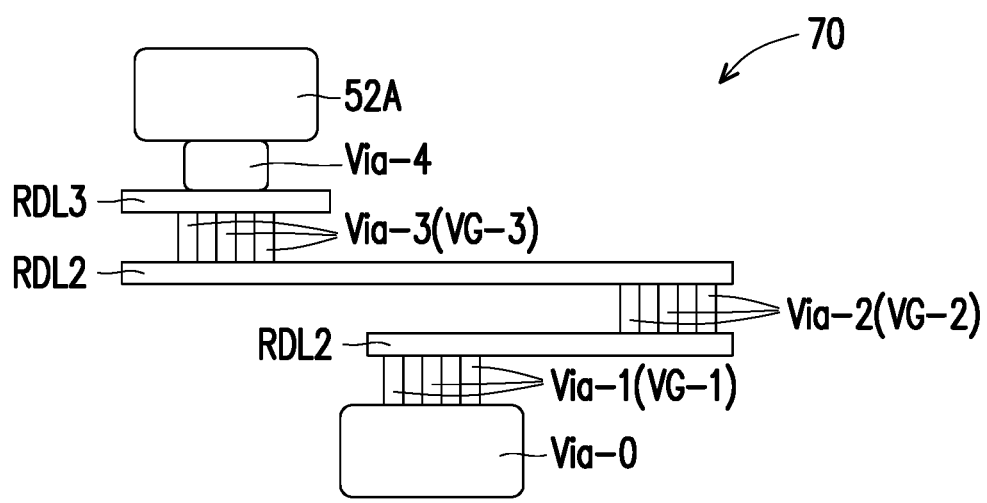

FIGS. 19A, 19B, 19C, and 19D illustrate a top view and cross-sectional views of non-ground-up connection structures 70 in accordance with some embodiments, in which via groups VG-2 are shifted away from the respective vias via-4. Other via groups VG-3 and VG-1 may or may not be overlapped by the respective vias via-4. FIG. 19A illustrates a top view, which shows that vias via-2 and the corresponding via group VG-2 are shifted away from both via via-4 and UBM 52A. FIG. 19B illustrates that via group VG-3 and via group VG-1 are overlapped by UBM 52A (and possibly via via-4). FIG. 19C illustrates that via group VG-3 is overlapped by UBM 52A (and possibly via via-4), while via group VG-1 is overlapped by via group VG-2 (with vias via-1 vertically misaligned with vias via-2). FIG. 19D illustrates that via group VG-3 is overlapped by UBM 52A (and possibly via via-4), while via group VG-1 is not overlapped by any of via group VG-3 and via group VG-2.

Figure 20A:
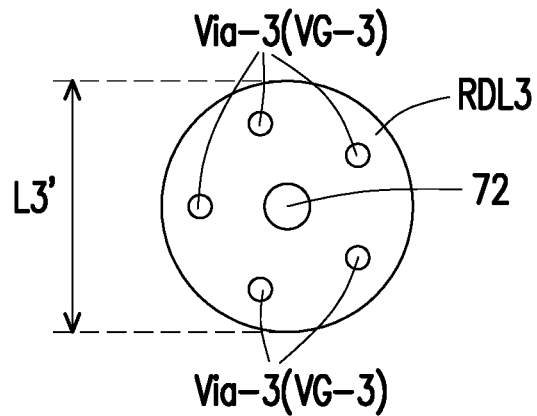
Figure 20B:
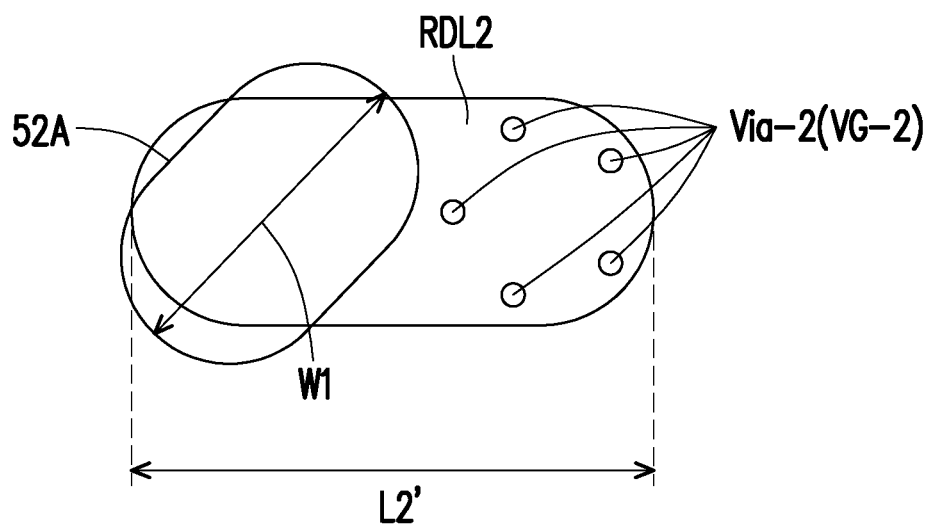
Figure 20C:
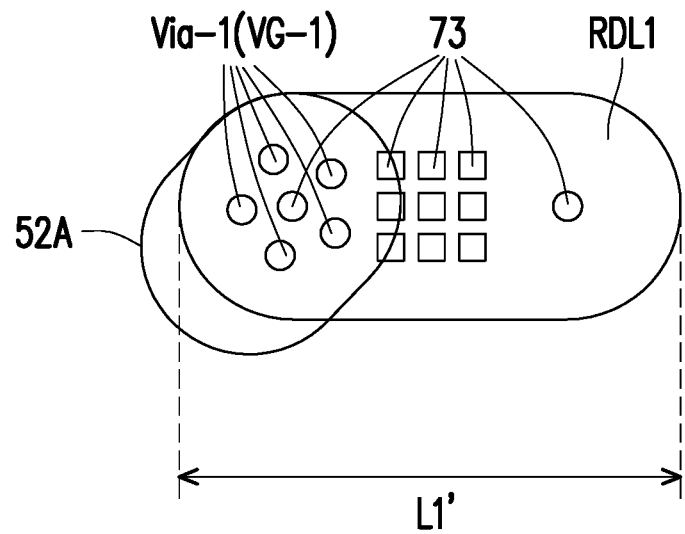

FIGS. 20A, 20B, and 20C illustrate the RDLs RDL3, RDL2, and RDL1 and vias via-4, via-3, via-2 and via-1 in accordance with some embodiments, which may correspond to the structure shown in FIGS. 19A and 19B. In accordance with some embodiments, UBM 52A (FIG. 20B) has lateral dimension W1, and RDLs RDL3, RDL2, and RDL1 have lengths L3', L2', and L1', respectively. In accordance with some embodiments, each of lengths L1', L2', and L3' is smaller than the square root of 2 times P, wherein P is the pitch of UBMs 52A, as shown in FIG. 14E. Holes 72 (FIG. 20A) and 73 (FIG. 20C) have dimensions smaller than lateral dimension W1 (FIG. 20B) of UBM 52A.

Figure 21A:
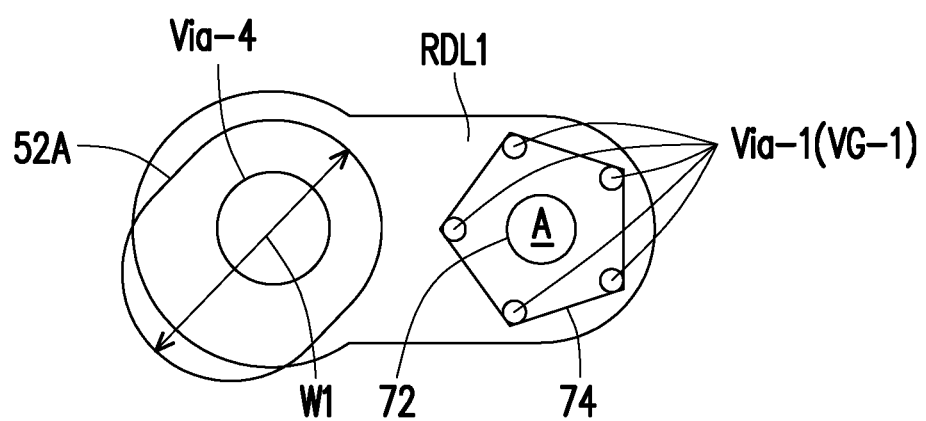
Figure 21B:
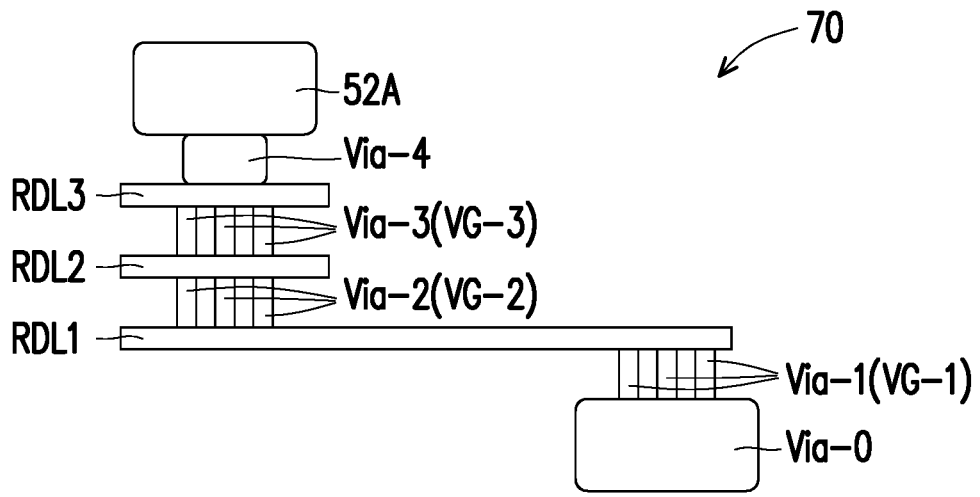
Figure 21C:
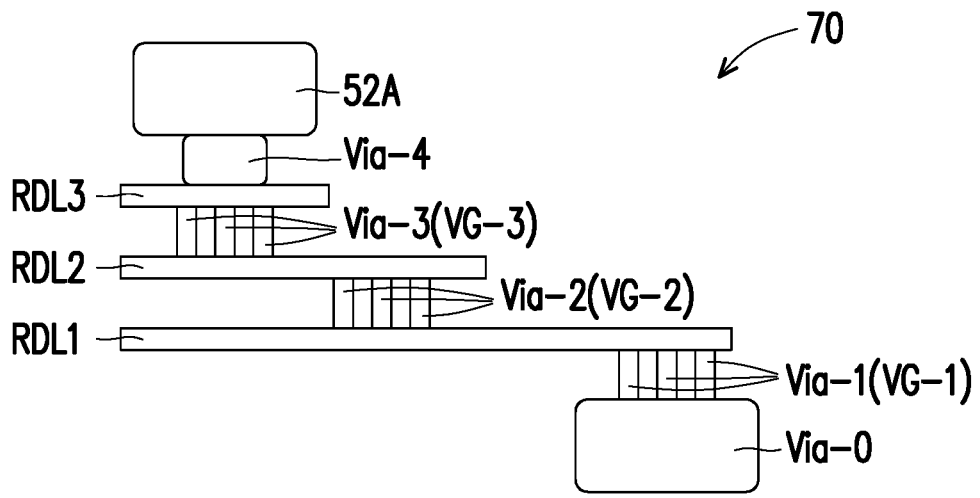

FIGS. 21A, 21B, and 21C illustrate a top view and cross-sectional views of non-ground-up connection structure 70 in accordance with some embodiments, in which via groups VG-1 are shifted away from the respective via via-4. Other via groups VG-2 and VG-3 may or may not be overlapped by via via-4. FIG. 21A illustrates a top view, which shows that vias via-1 and the corresponding via group VG-1 are shifted away from both via via-4 and UBM 52A. FIG. 21B illustrates that via groups VG-3 and VG-2 are overlapped by UBM 52A (and possibly via via-4). Similarly, vias via-3 are misaligned with vias via-2. FIG. 21C illustrates that via group VG-3 is overlapped by UBM 52A (and possibly via via-4), while both via groups VG-1 and VG-2 are shifted away from via via-4 and UBM 52A, and via group VG-1 is shifted with via group VG-2.

Figure 22A:
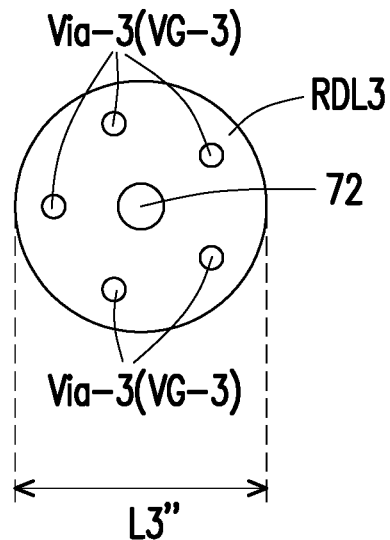
Figure 22B:
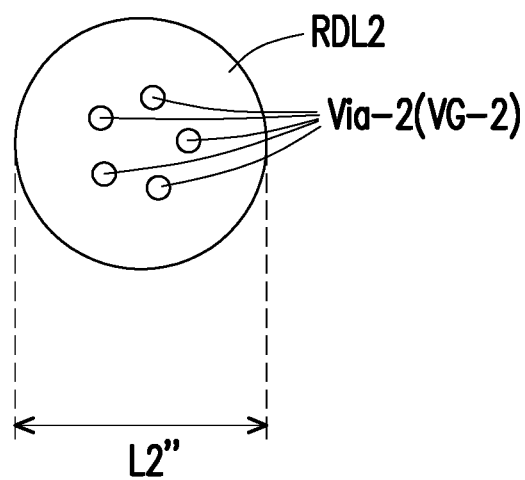
Figure 22C:
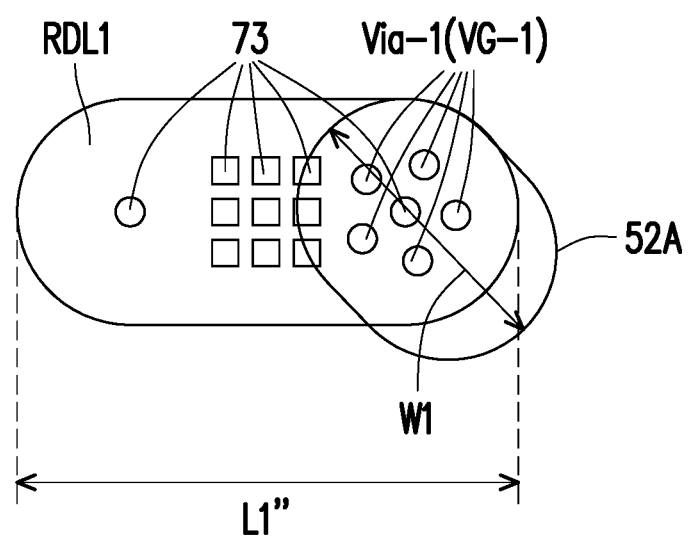

FIGS. 22A, 22B, and 22C illustrate RDLs RDL3, RDL2, and RDL1 and vias via-4, via-3, via-2 and via-1 in accordance with some embodiments, which may correspond to the structure shown in FIGS. 21A and 21B. In accordance with some embodiments, UBM 52A has lateral dimension W1 (FIG. 22C), and RDLs RDL3, RDL2, and RDL1 have lengths L3", L2", and L1", respectively. Length L3" is greater than length L2". In accordance with some embodiments, each of lengths L1", L2", and L3" is smaller than the square root of 2 times P, wherein P is the pitch of UBMs 52A, as shown in FIG. 14E. Holes 72 (FIG. 22A) and 73 (FIG. 22C) have dimensions smaller than lateral dimension W1 (FIG. 22C) of UBM 52A.

Figure 23:
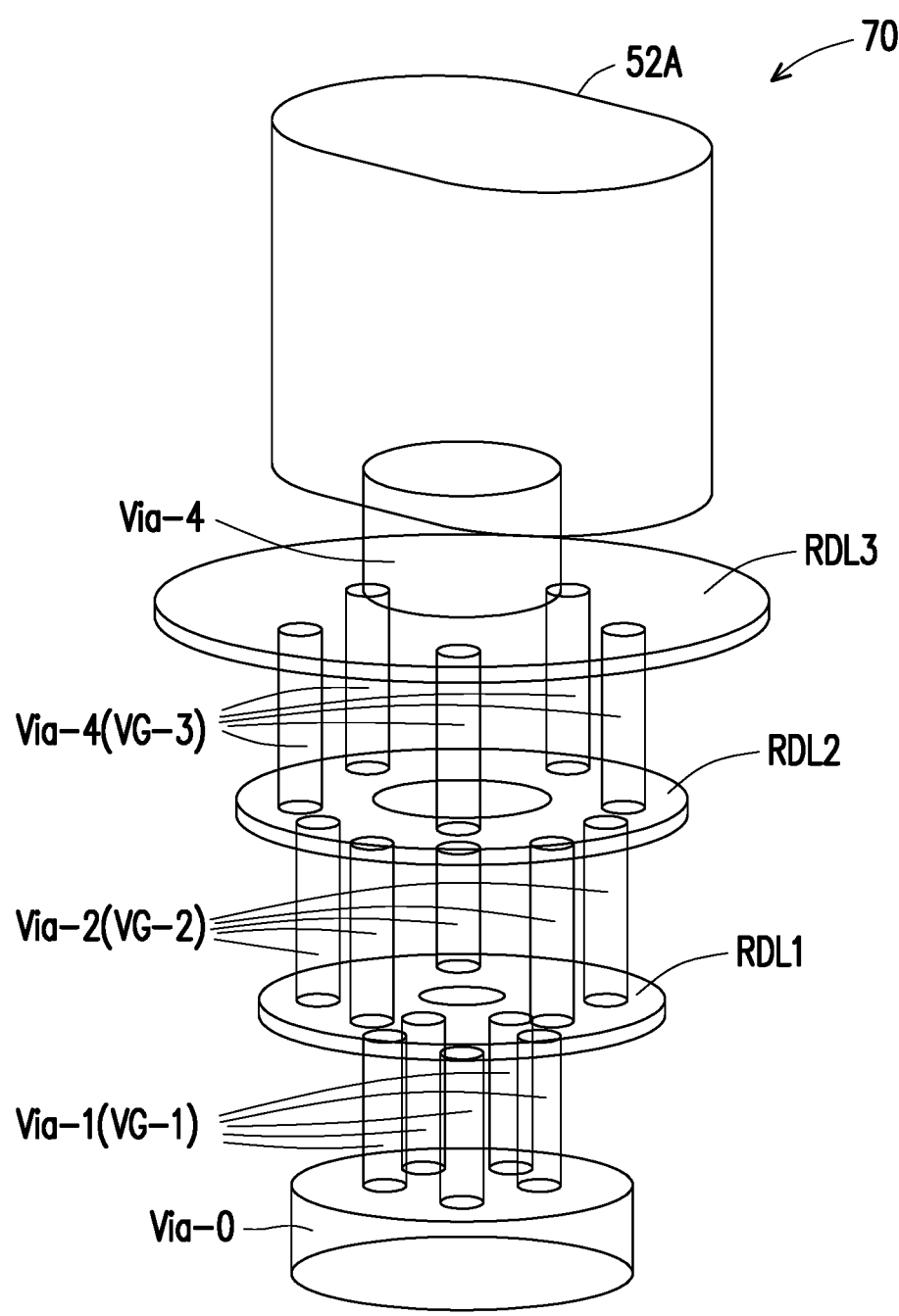
FIG. 23 illustrates a perspective view of a ground-up connection structure in accordance with some embodiments.

FIG. 23 illustrates a perspective view of a ground-up connection structure 70' in accordance with some embodiments. These embodiments also have the function of reducing stress. As shown in FIG. 23, a plurality layers of RDL traces RDL1, RDL2, and RDL3 and a plurality of composite vias via-1, via-2, and via-3 are connected to UBM 52A. The term "ground-up" indicates that the centers of all of RDLs RDL1, RDL2, and RDL3 and via groups VG-1, VG-2, and VG-3 are vertically aligned to the center of via via-4. However, vias via-1 and via-2 are not overlapped by the immediate overlying vias via-2 and via-3, respectively. Vias via-1 may be overlapped by vias via-3, or alternatively, vias via-1 may be misaligned with vias via-3.

Figure 24A:
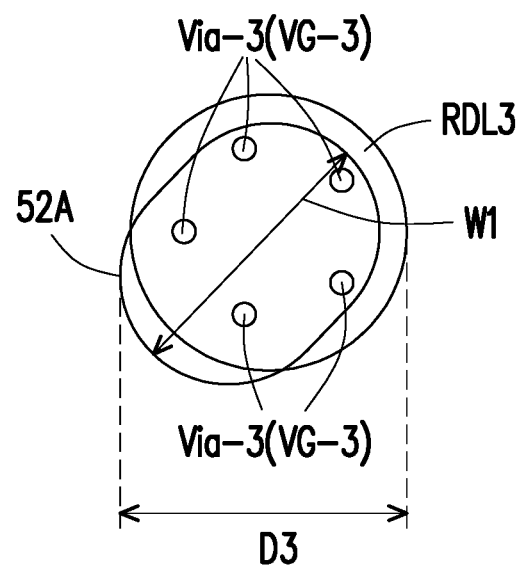
FIGS. 24A, 24B, and 24C illustrate the top views of conductive traces (pads) in a ground-up connection structure in accordance with some embodiments.
Figure 24B:
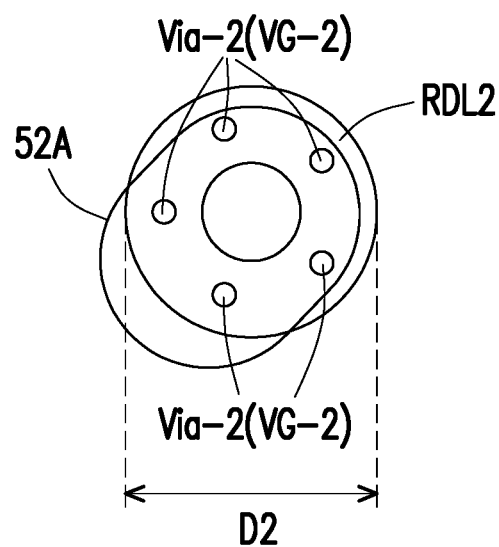
Figure 24C:
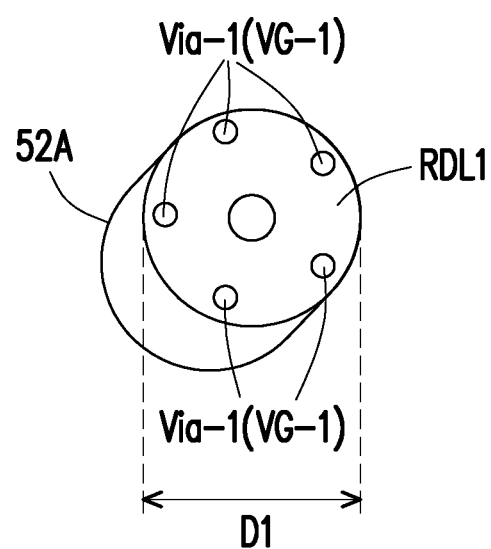

FIGS. 24A, 24B, and 24C illustrate the top views of RDLs RDL3, RDL2 and RDL1 and vias via-4, via-3, via-2 and via-1 in accordance with some embodiments, which may correspond to the structure shown in FIG. 23. In accordance with some embodiments, RDLs RDL3, RDL2, and RDL1 have round top-view shapes. UBM 52A has lateral dimension W1, and RDLs RDL3, RDL2, and RDL1 have diameters D3, D2, and D1, respectively. In accordance with some embodiments, each of diameters D1, D2, and D3 is in the range between about 0.5 W1 and about 1.5 W1.

FIGS. 25 and 26 illustrate the top views (layouts) of packages 60 in accordance with some embodiments. In accordance with some embodiments, package component 26A is a large package component, whose top-view area may be greater than about 60 percent of the top-view area of package 60. It is appreciated that interconnection structure 49 (FIG. 9) includes high-stress regions suffering from higher stresses and low-stress regions suffering from lower stresses. The high-stress regions include regions 126A, which overlap the peripheral regions (including corner regions and edge regions) of package component 26A. In accordance with some embodiments, the peripheral region of package component 26A is the region measured from the edges of package component 26A and having width Wa1 and Wa2, which are smaller than about 20 percent the corresponding width Wb1 and Wb2, respectively. The low-stress portions include region 126B, which is directly over the center portion of package components 26B. The low-stress portions may also include the portions directly over package components 26B, which introduces low stresses due to their relatively small areas. Some high-stress regions 126A and low-stress regions 126B are schematically illustrated in FIG. 9 as well. In accordance with some embodiments, non-ground-up connection structure 70 (FIG. 11) and ground-up connection structure 70' (FIG. 23) are formed in the high-stress regions. In the low-stress regions 126B, the non-ground-up connection structure 70 (FIG. 11), ground-up connection structure 70', and in addition, the single-via connection structure 70" (FIG. 27) may be formed in any combination.

Figure 27:
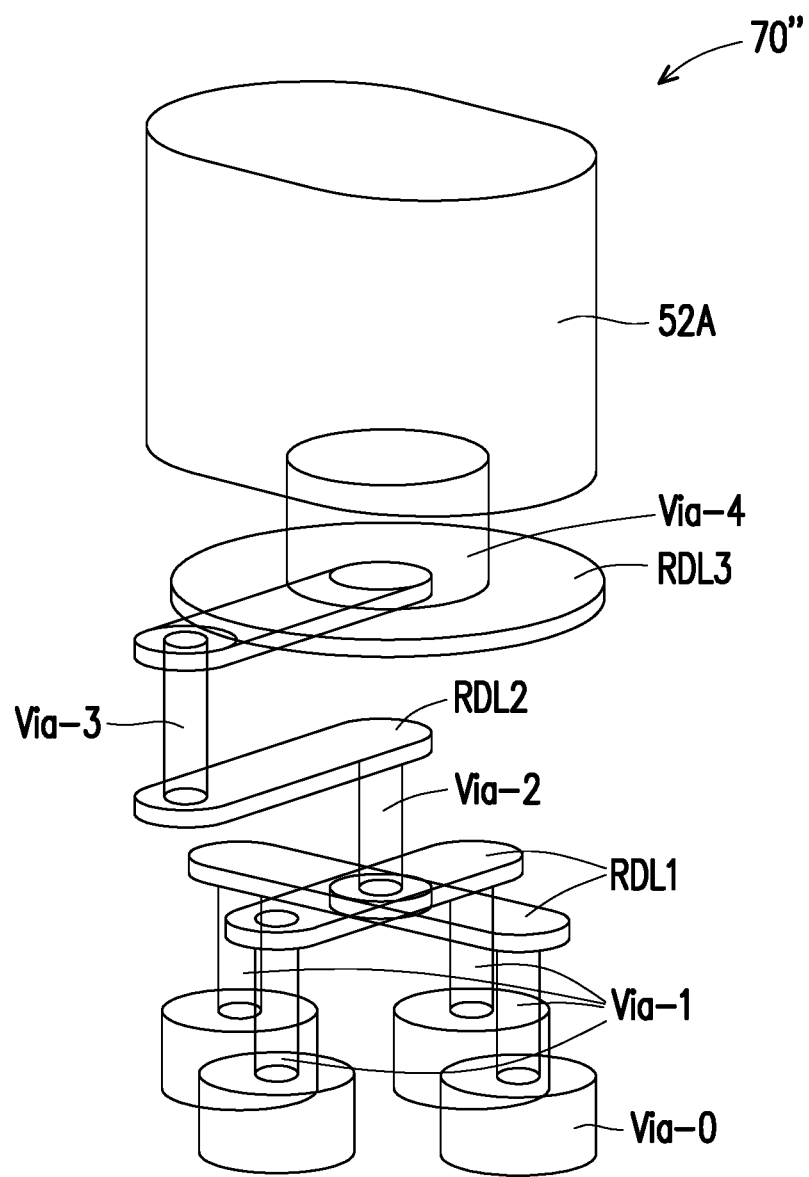
FIG. 27 illustrates a connection structure including single-via connections in accordance with some embodiments.

In FIG. 27, there may be a single via connecting an RDL trace to an underlying RDL trace. Furthermore, via via-3 may be shifted away from via via-4, but the shift distance may or may not be big enough, and via via-3 may be or may not be covered by UBM 52A and/or via via-4. Accordingly, the single-via connection structure 70" suffers from a higher stress (and has lower reliability) than both non-ground-up connection structure 70 and ground-up connection structure 70'. However, since single-via connection structures 70" are formed in low-stress regions, its reliability may still be able to meet design specification. Single-via connection structures 70" will not be formed in high-stress regions 126A (FIGS. 25 and 26). Single-via connection structure 70" provides more flexibility in design and may take small chip area due to the single-via connection.

FIG. 26 illustrates a top view of package 26 in accordance with some embodiments. These embodiments are similar to the embodiments in FIG. 25, except there are more package components 26B formed. Similarly, high-stress regions 126A, in which non-ground-up connection structure 70 (FIG. 11) and ground-up connection structure 70' (FIG. 23) are formed, are marked. Single-via connection structures 70" are not formed in high-stress regions 126A. The non-ground-up connection structure 70, ground-up connection structure 70', and the single-via connection structure 70" may be formed in low-stress regions 126B in any combination.

Further referring to FIGS. 25 and 26, since non-ground-up connection structure 70 has good reliability, the regions in which stresses are greatest, such as the regions over the corner regions of package component 26A have non-ground-up connection structure 70 but may not have single-via connection structure 70". The regions directly over the edge portions (excluding corner regions) of package component 26A may include non-ground-up connection structure 70 and/or ground-up connection structure 70', but are free from single-via connection structure 70".

Figure 28:
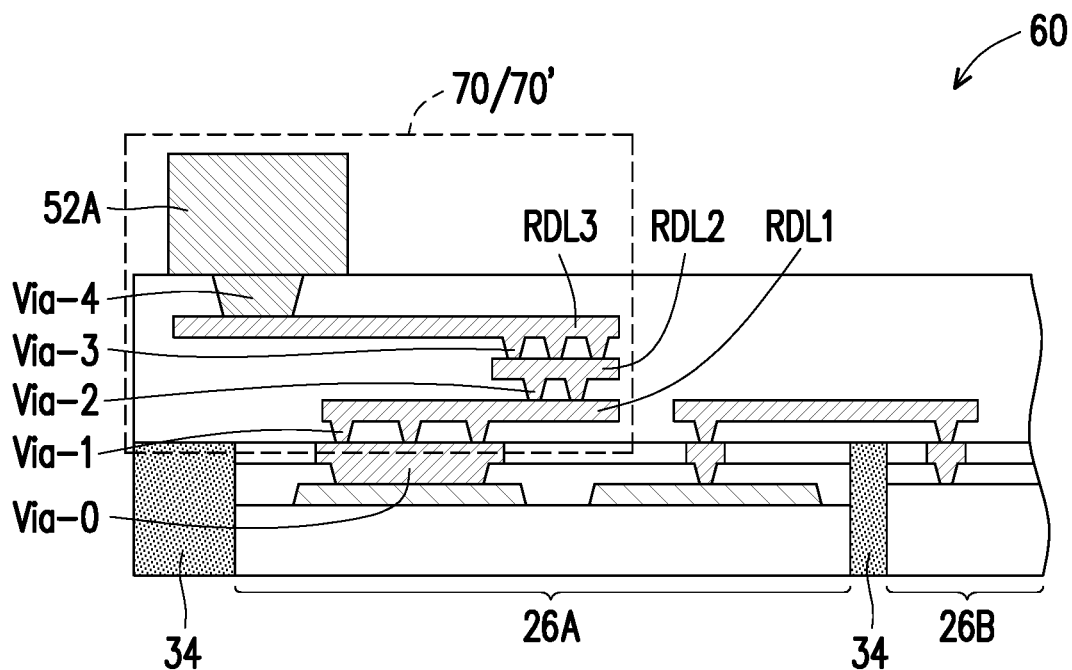
FIGS. 28 through 31 illustrate via-0 structures and corresponding packages in accordance with some embodiments.
Figure 29:
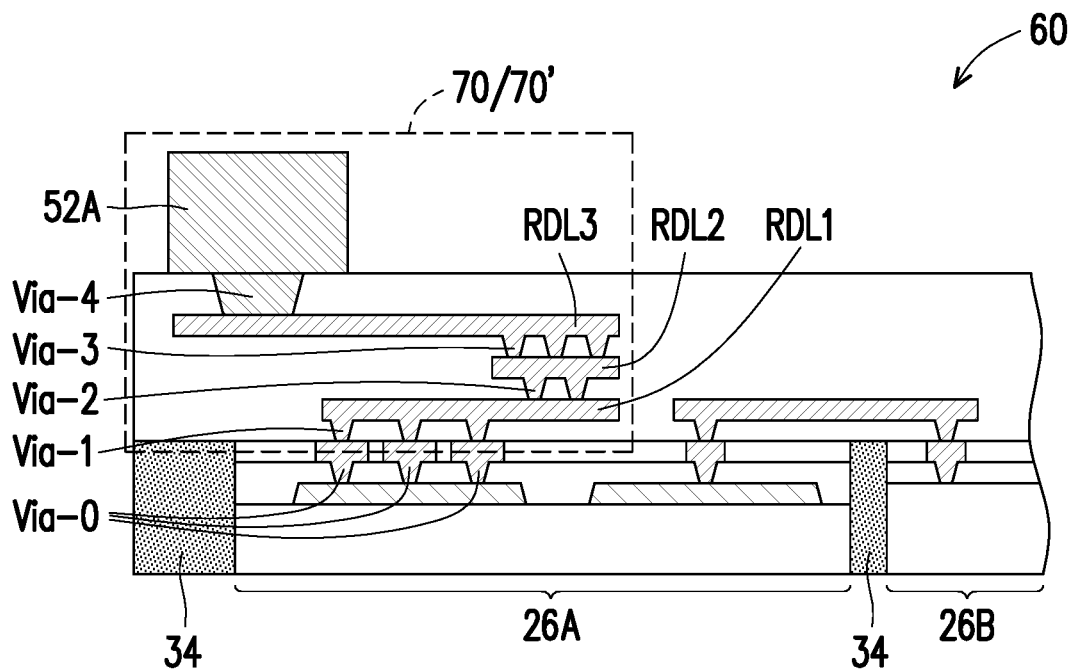
Figure 30:
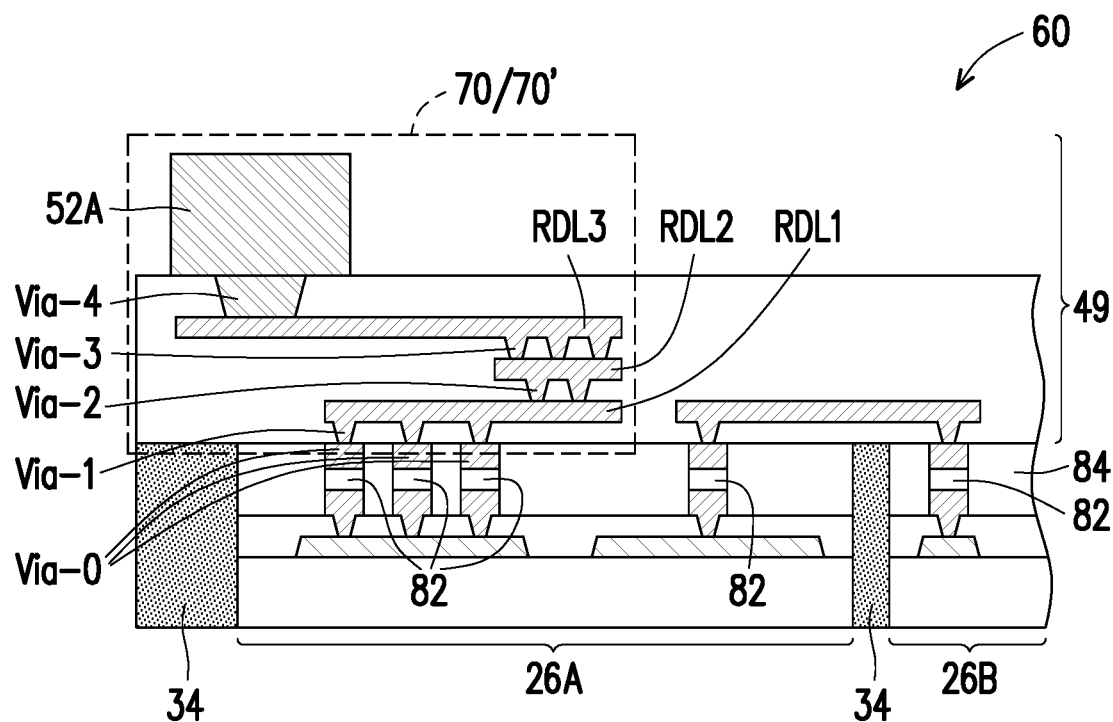
Figure 31:
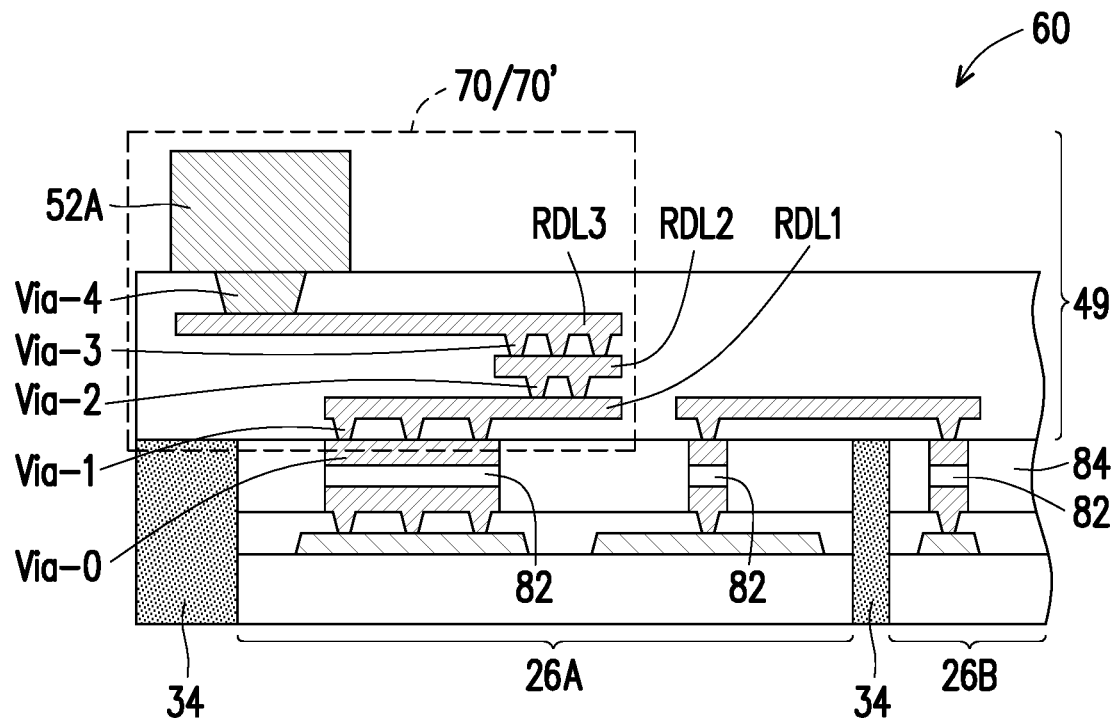

FIGS. 28 through 31 illustrate the cross-sectional views of some portions of packages 60 in accordance with some embodiments, in which connection structures 70 and the corresponding connection to package components 26A and 26B are illustrated. In FIGS. 28 and 31, there is a single via via-0 connected with a plurality of vias via-1. In FIGS. 29 and 30, there are multiple vias via-0 connected with a plurality of vias via-1. It is appreciated that the structures as shown in FIGS. 28 through 31 may be adopted in the embodiments shown in each of the embodiments discussed referring to FIG. 11 through FIGS. 24A/24B/24C. The packages shown in FIGS. 28 and 29 may be formed by adopting the processes shown in FIGS. 1 through 10. The packages shown in FIGS. 30 and 31 may be formed by forming interconnection structure 49 first as a substrate, and then bonding package components 26A and 26B to the already-formed interconnect structure 49 through flip-chip bonding, with solder regions 82 used in the bonding. Underfill 84 may then be applied, and encapsulant 34 may be dispensed to form the structures shown in FIGS. 30 and 31.

In accordance with some embodiments of the present disclosure, connection structures 70 (FIG. 11), 70' (FIG. 23), and 70" (FIG. 27) are single-branch connection structures, which means that RDL traces RDL1, RDL2, and RDL3 are not connected sideways to any other conductive feature. Alternatively stated, all sidewalls of each of the conductive traces RDL1, RDL2, and RDL3 are in contact with dielectric materials. Accordingly, the current flowing through via-4 will be equal to the current flowing through via-0.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming via groups (rather than single-via connections) for interconnecting RDL traces, the reliability of the corresponding connection structures is improved. Furthermore, by adopting the non-ground-up structures and ground-up structures in high-stress regions, stress may be released, and hence the reliability of the connection structure is further improved.

In accordance with some embodiments of the present disclosure, a method includes placing a package component over a carrier; encapsulating the package component in an encapsulant; and forming a first connection structure over and electrically coupling to the package component, wherein the forming the first connection structure comprises: forming a first via group over and electrically coupling to the package component; forming a first conductive trace over and contacting the first via group; forming a second via group overlying and contacting the first conductive trace, wherein each of the first via group and the second via group comprises a plurality of vias; forming a second conductive trace over and contacting the second via group; forming a top via overlying and contacting the second conductive trace; and forming an UBM over and contacting the top via. In an embodiment, the method further comprises forming a solder region over and contacting the UBM. In an embodiment, a contour area of one of the first via group and the second via group is vertically shifted away from the top via. In an embodiment, the forming the first via group comprises: forming a dielectric layer over the package component and the encapsulant; forming openings in the dielectric layer to expose underlying conductive features; and forming the first conductive trace and the first via group through a plating process. In an embodiment, the first via group is electrically coupling to a surface via in the package component, and the top via overlaps the surface via, and a contour area of one of the first via group and the second via group is further vertically misaligned with both the top via and the surface via. In an embodiment, the method further forming a third conductive trace underlying and contacting the first via group; and forming a third via group underlying and contacting the third conductive trace, wherein the third via group is further overlying and contacting the surface via in the package component. In an embodiment, a center of the first via group is vertically aligned to a center of the second via group, and vias in the first via group are vertically misaligned with vias in the second via group. In an embodiment, the first connection structure overlaps a peripheral region of the package component, and the method further comprises forming a second connection structure overlapping a center region of the package component, and the forming the second connection structure forming a single via over and electrically coupling to the package component; forming an additional conductive trace overlying and contacting the single via; forming an additional top via overlying and contacting the additional conductive trace; and forming an additional UBM over and contacting the additional top via, wherein a center the single via is vertically shifted away from the additional top via. In an embodiment, the additional top via comprises a portion overlapped by the additional UBM.

In accordance with some embodiments of the present disclosure, a method comprises placing a first package component and a second package component over a carrier, wherein the first package component has a greater top-view area than the second package component, and the first package component comprises an electrical connector; encapsulating the first package component and the second package component in an encapsulant; forming a first connection structure over a peripheral region of the first package component, wherein the first connection structure is electrically coupled to the electrical connector, and the first connection structure comprises a first metal pillar; a first top via underlying and electrically coupling to the first metal pillar; a first conductive trace underlying the first top via; a first via group underlying and contacting the first conductive trace, wherein the first via group comprises a first plurality of vias, and the first via group has a first contour area; a second conductive trace underlying and electrically coupling to the first via group; and a second via group underlying and contacting the second conductive trace, wherein the second via group comprises a second plurality of vias, and the second via group has a second contour area overlapped by the first contour area. In an embodiment, the method further comprises sawing through the encapsulant to form a discrete package, wherein a first top-view area of the first package component is greater than about 60 percent of a top-view area of the discrete package. In an embodiment, the first plurality of vias are vertically misaligned with the second plurality of vias. In an embodiment, a center of the first contour area overlaps a center of the second contour area. In an embodiment, the method further comprises forming an additional connection structure overlapping and electrically coupling to an additional electrical connector in the second package component, wherein the additional connection structure uses a single via to electrically connect two conductive traces in the additional connection structure. In an embodiment, in a top view of the first connection structure, the first plurality of vias and the second plurality of vias are aligned to a same circular ring, and the first plurality of vias are vertically misaligned with the second plurality of vias.

In accordance with some embodiments of the present disclosure, a package comprises an UBM; a top via underlying and electrically coupling to the UBM; a first conductive trace underlying and electrically coupling to the top via; a first via group underlying and contacting the first conductive trace, wherein the first via group comprises a first plurality of vias, and the first via group has a first contour area; a second conductive trace underlying and electrically coupling to the first via group; and a second via group underlying and contacting the second conductive trace, wherein the second via group comprises a second plurality of vias, and the second via group has a second contour area overlapped by the first contour area, and the first plurality of vias are vertically misaligned with the second plurality of vias. In an embodiment, the package further includes a device die comprising a metal pillar; an encapsulant encapsulating the device die therein; and a dielectric layer overlapping and contacting both the encapsulant and the metal pillar, wherein the metal pillar is underlying and contacting bottom surfaces of the second plurality of vias. In an embodiment, the metal pillar is overlapped by the UBM. In an embodiment, the UBM overlaps a peripheral region of the device die. In an embodiment, the first plurality of vias are allocated symmetric to a first vertical center line, and the second plurality of vias are allocated symmetric to a second vertical center line, and the first vertical center line and the second vertical center line are vertically misaligned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    placing a package component over a carrier;
    encapsulating the package component in an encapsulant; and
    forming a first connection structure over and electrically coupling to the package component, wherein the forming the first connection structure comprises:
        forming a first via group over and electrically coupling to the package component, wherein the first via group comprises a first plurality of vias;
        forming a first conductive trace over the first via group, wherein a first bottom surface of the first conductive trace physically contacts a first top surface of each of the first plurality of vias;
        forming a second via group overlying the first conductive trace, wherein the second via group comprises a second plurality of vias, and wherein a second bottom surface of each of the second plurality of vias physically contacts a second top surface of the first conductive trace;
    forming a second conductive trace over and physically contacting the second via group;
    forming a top via overlying the second conductive trace; and
    forming an Under-Bump-Metallurgy (UBM) over and contacting the top via.

2. The method of claim 1 further comprising forming a solder region over and contacting the UBM.

3. The method of claim 1, wherein a contour area of one of the first via group and the second via group is vertically shifted away from the top via.

4. The method of claim 1, wherein the forming the first via group comprises:
    forming a dielectric layer over the package component and the encapsulant;
    forming openings in the dielectric layer to expose; and
    forming the first via group in the openings.

5. The method of claim 1, wherein the first via group is electrically coupling to a surface via in the package component, and the top via overlaps the surface via, and a contour area of one of the first via group and the second via group is further vertically misaligned with both the top via and the surface via.

6. The method of claim 5, wherein the method further comprises:
    forming a third conductive trace underlying and contacting the first via group; and
    forming a third via group underlying and contacting the third conductive trace, wherein the third via group is further overlying and contacting the surface via in the package component.

7. The method of claim 1, wherein a center of the first via group is vertically aligned to a center of the second via group, and vias in the first via group are vertically misaligned with vias in the second via group.

8. The method of claim 1, wherein the first connection structure overlaps a peripheral region of the package component, and the method further comprises forming a second connection structure overlapping a center region of the package component, and the forming the second connection structure comprises:
    forming a single via over and electrically coupling to the package component;
    forming an additional conductive trace overlying and contacting the single via;
    forming an additional top via overlying and contacting the additional conductive trace; and
    forming an additional UBM over and contacting the additional top via, wherein a center the single via is vertically shifted away from the additional top via.

9. The method of claim 8, wherein the additional top via comprises a portion overlapped by the additional UBM.

10. A method comprising:
placing a first package component and a second package component over a carrier, wherein the first package component has a greater top-view area than the second package component, and the first package component comprises an electrical connector;
encapsulating the first package component and the second package component in an encapsulant;
forming a first connection structure over a peripheral region of the first package component, wherein the first connection structure is electrically coupled to the electrical connector, and the first connection structure comprises:
a first metal pillar;
a first top via underlying and electrically coupling to the first metal pillar;
a first conductive trace underlying the first top via;
a first via group underlying and contacting the first conductive trace, wherein the first via group comprises a first plurality of vias, each in physical contact with the first conductive trace, and the first via group has a first contour area;
a second conductive trace underlying and electrically coupling to the first via group; and
a second via group underlying the second conductive trace, wherein the second via group comprises a second plurality of vias, each in physical contact with the second conductive trace, and the second via group has a second contour area overlapped by the first contour area.

11. The method of claim 10 further comprising sawing through the encapsulant to form a discrete package, wherein a first top-view layout area of the first package component is greater than about 60 percent of a top-view layout area of the discrete package.

12. The method of claim 10, wherein the first plurality of vias are vertically misaligned with the second plurality of vias.

13. The method of claim 12, wherein a center of the first contour area overlaps a center of the second contour area.

14. The method of claim 10 further comprising forming an additional connection structure overlapping and electrically coupling to an additional electrical connector in the second package component, wherein the additional connection structure uses a single via to electrically connect two conductive traces in the additional connection structure.

15. The method of claim 10, wherein in a top view of the first connection structure, the first plurality of vias and the second plurality of vias are aligned to a same circular ring, and the first plurality of vias are vertically misaligned with the second plurality of vias.

16. A method comprising:
encapsulating a device die in an encapsulant, wherein the device die comprises a conductive feature at a surface of the encapsulant;
forming a first via group overlying and contacting the conductive feature;
forming a first conductive trace overlying and contacting the first via group;
forming a second via group overlying and contacting the first conductive trace, the second via group is vertically misaligned from the first via group;
forming a second conductive trace over and contacting the second via group; and
forming an Under-Bump-Metallurgy (UBM) over the second conductive trace, wherein the UBM is electrically coupling to the conductive feature through the second conductive trace and the first conductive trace, and wherein a first center of the UBM is vertically aligned to a second center of the conductive feature, and the UBM is vertically misaligned from the second via group.

17. The method of claim 16 further comprising forming a solder region over and contacting the UBM.

18. The method of claim 16, wherein the first conductive trace comprises a degassing hole, wherein in a top view of the second via group, the degassing hole is surrounded by vias in the second via group.

19. The method of claim 16, wherein the conductive feature has a first top surface coplanar with a second top surface of the encapsulant.

20. The method of claim 16, wherein the first via group comprises a first plurality of vias, and bottom surfaces of the first plurality of vias are in physical contact with the conductive feature, and the first conductive trace is in physical contact with the first plurality of vias in the first via group.

* * * * *